United States Patent
Olson et al.

(10) Patent No.: US 7,633,293 B2
(45) Date of Patent: Dec. 15, 2009

(54) RADIO FREQUENCY FIELD LOCALIZATION FOR MAGNETIC RESONANCE

(75) Inventors: Christopher C. Olson, Minneapolis, MN (US); J. Thomas Vaughan, Stillwater, MN (US); Anand Gopinath, Wayzata, MN (US)

(73) Assignee: Regents of the University of Minnesota, Minneapolis, MN (US)

( * ) Notice: Subject to any disclaimer, the term of this patent is extended or adjusted under 35 U.S.C. 154(b) by 0 days.

(21) Appl. No.: 11/800,055

(22) Filed: May 3, 2007

(65) Prior Publication Data
US 2008/0088305 A1    Apr. 17, 2008

Related U.S. Application Data

(60) Provisional application No. 60/797,712, filed on May 4, 2006.

(51) Int. Cl.
*G01V 3/00* (2006.01)
(52) U.S. Cl. ........................ 324/318; 324/309
(58) Field of Classification Search ......... 324/300–322; 600/407–439
See application file for complete search history.

(56) References Cited

U.S. PATENT DOCUMENTS

| | | | | |
|---|---|---|---|---|
| 6,075,365 | A * | 6/2000 | Conolly | 324/320 |
| 6,087,832 | A * | 7/2000 | Doty | 324/318 |
| 6,400,310 | B1 * | 6/2002 | Byrnes et al. | 342/115 |
| 6,621,433 | B1 * | 9/2003 | Hertz | 341/139 |
| 6,633,161 | B1 | 10/2003 | Vaughan, Jr. | |
| 6,650,118 | B2 * | 11/2003 | Leussler | 324/318 |
| 6,861,840 | B2 * | 3/2005 | Frederick et al. | 324/307 |
| 6,900,636 | B2 * | 5/2005 | Leussler | 324/318 |
| 6,969,992 | B2 * | 11/2005 | Vaughan et al. | 324/318 |
| 7,301,341 | B2 | 11/2007 | Hargreaves | |
| 7,466,131 | B1 * | 12/2008 | Xu et al. | 324/318 |

OTHER PUBLICATIONS

J. Thomas Vaughan et al., High Frequency Volume Coils for Clinical NMR Imaging and Spectroscopy, Magnetic Resonance in Medicine, Aug. 1, 1994, pp. 206-218.
D. Diehl et al., B1 Homogenization at 3 T MRI using a 16 Rung Transmit Array, International Society for Magnetic Resonance in Medicine, Jul. 13, 2005, p. 2751, ISMRM 13th Scientific Meeting.
T. Ibrahim., RF Selective Excitation for Localized Imaging at 9.4 Tesla, International Society for Magnetic Resonance in Medicine, Jul. 13, 2005, p. 890, ISMRM 13th Scientific Meeting.
Vaughan, Jr. et al., U.S. Appl. No. 60/508,662, filed Oct. 3, 2003.
Boyd et al., Convex Optimization, Cambridge University Press, 2004, 730 pages.

* cited by examiner

*Primary Examiner*—Brij B Shrivastav
(74) *Attorney, Agent, or Firm*—Crompton, Seager & Tufte LLC

(57) ABSTRACT

Technology for controlling non-uniformity in the $B_1$ field includes selecting the phase, magnitude, frequency, time, or spatial relationship among various elements of a multi-channel excitation coil in order to control the radio frequency (RF) power emanating from the coil antenna elements. Non-uniformity can be used to steer a constructively interfering $B_1$ field node to spatially correlate with an anatomic region of interest. A convex (quadratically constrained quadratic problem) formulation of the $B_1$ localization problem can be used to select parameters for exciting the coil. Localization can be used in simulated Finite Difference Time Domain $B_1$ field human head distributions and human head phantom measurement.

20 Claims, 22 Drawing Sheets

RADIO FREQUENCY FIELD LOCALIZATION FOR MAGNETIC RESONANCE

CROSS-REFERENCE TO RELATED PATENT DOCUMENTS

This patent application claims the benefit of priority, under 35 U.S.C. Section 119(e), to Olson, U.S. Provisional Patent Application Ser. No. 60/797,712, entitled RF FIELD LOCALIZATION THROUGH CONVEX OPTIMIZATION, filed on May 4, 2006, which is herein incorporated by reference.

GOVERNMENT RIGHTS

This invention was made with Government support under Grant Numbers NIH-R01 EB000895 and NIH-P41 RR08079, awarded by the National Institutes of Health. The Government has certain rights in this invention

TECHNICAL FIELD

This document pertains generally to magnetic resonance spectroscopy, and more particularly, but not by way of limitation, to radio frequency field localization for magnetic resonance.

BACKGROUND

For high field MRI, the degradation of homogeneity of the transverse magnetic field ($B_1$) causes poor image quality and other performance problems. Problems include pronounced $B_1$ field contours and consequential image inhomogeneity.

OVERVIEW

As MRI $B_0$ field strength increases, the Larmor frequency increases causing the assumption of uniform $B_1$ field magnitude throughout an imaged load to become a poor approximation. Because of non-uniformity, for example, methods are presented to adjust antenna drive element's phase and magnitude with the goal of improving uniformity. The present subject matter includes controlling $B_1$ field magnitude to achieve a desired $B_1$ magnitude distribution. Desired distributions can be chosen to improve uniformity or can be used to achieve field localization.

In the MRI process a nuclear magnetic resonance is used to probe inside a load (a human body for example) in a noninvasive and nondestructive way. The received signal from different atoms is slightly different allowing imaging of the load.

To setup a resonance, a +z directional DC field called the $B_0$ field is created with a powerful electromagnet. The $B_0$ field strength assumed in this project will be 9.4 Tesla. Additionally a transverse RF field called the $B_1$ field is used to drive the resonance from various RF antennas. The $B_1$ field lies principally in the x,y plane. z directional components will be neglected herein as their effect is small compared with the much larger $B_0$ field strength. Additionally, several gradient (quasi DC) coils are used in the imaging process and are also neglected here.

$B_1$ field frequency is related to $B_0$ field strength through the Larmour relationship: $w = \gamma_g B_0$ where $\gamma_g$ is the gyrometric ratio and w is the angular frequency. As $B_0$ field strength has increased in research machines, the required $B_1$ frequency has increased and the wavelength has decreased. Traditionally the $B_1$ field phase and magnitude have been assumed to be uniform for simplicity. However as frequency increases, this assumption breaks down. This has manifest itself as light and dark spots in the MRI image due to constructive and destructive interference of $B_1$ field patterns.

Some have employed guess and check techniques to adjust phase and magnitude of the RF signal strength fed to the RF antenna elements. This involves RF shimming to increase signal strength to antenna elements near dark parts of the load as seen in the image to attempt to brighten the image. Clearly a more systematic approach is necessary.

The proposed approach makes use of additional data obtained from RF field simulation or measurement. Using any RF field simulation or measurement technique (FDTD, Finite Element, Integral Equation, Analytical Solution, B Field Mapping, etc.) or combination thereof, the $B_1$ response to a single RF antenna element is calculated for a x,y slice of the load. Repeating this process for each antenna element gives the R field effect data for each point in the x,y slice caused by each antenna element. The combined effect of the individual antennas at different signal strength levels and phases is calculated at each point in the load. Then, using a desired x,y field map as the objective target, an optimization formulation is made to control phase and magnitude of the signal to each antenna element.

A convex optimization technique is used to determine the magnitude and phase of each antenna element to obtain a desired field distribution. The advantages of convex optimization over other types of optimization formulations are numerous. Problems that can be cast as convex problem have efficient and accurate solution techniques that lead to true global optimality with polynomial effort. These results can also be found to a desired level of accuracy.

Let the elements of $B_x \in \mathbb{C}^{m \times n}$ and $B_y \in \mathbb{C}^{m \times n}$ be the set of x and y direction $B_1$ field at n locations inside the load due to the m antenna elements. The $i^{th}$ column of these vectors correlate to a point in the load. Also let $w \in \mathbb{C}^m$ be the drive vector where the $j^{th}$ entry represents the signal strength and phase driven at the $j^{th}$ antenna element. Finally, let $d_i \in \mathbb{R}^n$ the desired net positively polarized transmit $B_1$ field magnitude at the each of the n locations in the inside the load and let $r_i \in \mathbb{C}^n$ be the residual difference between the actual and the desired positively polarized transmit $B_1$ field magnitude. The net $B_{ij}^{+T}$ (positively polarized transmitted) field (denoted $B_{ij}^T$ here on) is given by $$\frac{1}{2}(B_{xij}^T \omega + jB_{yij}^T \omega)$$

A new matrix can be defined as $$B_{ij} = \frac{1}{2}(B_{xij} + jB_{yij})$$

Then the magnitude of the net $B_i$ field vector in the load is $$\|B_{ij}^T w\|.$$

This is the magnitude to be shaped to match D. The problem to design w, as stated in words, is expressed mathematically as the following optimization problem.

$$\min \sum_{i=1}^{n} T_i$$
$$\text{s.t.} \quad \|B_i^T \omega\| \le d_i + r_i \quad i = 1 \ldots n$$
$$\|B_i^T \omega\| \ge d_i - r_i \quad i = 1 \ldots n$$
$$\|\omega_j\| \le p_{max} \quad j = 1 \ldots m$$

The last constraint represents the fact that there is an upper limit on the amount of power that can be driven at each antenna element.

The variables in this optimization are w and r. The first constraint is a convex second order cone constraint in the free variables and can be easily handled by convex optimization theory. The third constraint is similarly a second order cone constraint in the free variable w. The second constraint however is non-convex and generally difficult to optimize over. (nondeterministic polynomial-hard). To simplify the problem to a convex problem, a technique known as SDP relaxation is employed.

The second constraint, through appropriate mathematical manipulation, can be shown to be completely equivalent to the following set of three constraints.

$$Tr(b_i b_i^T W) \ge (d_i - r_i)^2 \, i = 1 \ldots n$$
$$W \succeq ww^T$$
$$Rank(W) = 1$$

Here '$\succeq$' indicates the linear matrix inequality. Of the three new constraints, only the Rank(W)=1 constraint is non convex in the variables r and w and will be dropped to complete the relaxation. The optimization problem is now a mixed Semidefinite Program/Second Order Cone Program (SDP/SOCP) of the following form.

$$\min \sum_{i=1}^{n} r_i \quad i = 1 \ldots n$$
$$\text{s.t.} \quad \|b_i^T \omega\| \le d_i + r_i \quad i = 1 \ldots n$$
$$\|\omega_j\| \le p_{max} \quad j = 1 \ldots m$$
$$Tr(b_i b_i^T W) \ge (d_i - r_i)^2 \quad i = 1 \ldots n$$
$$W \succeq ww^T$$

Note also that weights can be placed on each $r_i$ term in the objective function to emphasize added importance of meeting the desired distribution at location i. Constraints can easily be added or subtracted as necessary to adjust the algorithm to particular situations. The practical limits on the constraints are those laid out by convexity theory. For example, unequal available signal power at each antenna element can be accommodated by varying $p_{max}$ with j. Push down constraints can be dropped where it is preferred to let $p_{max}$ set the upper limit. Fixed push down constraints can be set to upper bound field magnitude at various i locations.

The non-convex quadratically constrained quadratic program is a nondeterministic polynomial-hard problem and thus intractable. However, through relaxation a provably good solution can be found with a deterministic suboptimality in polynomial time. This relaxation can be solved by interior point method codes.

Through suitable manipulation, the problem can be recast for solution by, for example, SeDuMi. Any code capable of solving a Semidefinite Program can be used.

After the convex relaxation is solved, the rank one constraint that was dropped is be recovered (the solution must reenter or be mapped to the feasible domain). This is accomplished through randomization. A normal Gaussian distribution with mean around the optimal relaxed solution and variance given by $W - ww^T$.

In practice, m can be 2, 4, 8, 16, 32, or any other number and in one example, an RF antenna set (RF coil) including 16 elements was examined. n is allowed to vary to fit computer capacity. Data can be calculated for arbitrarily many points inside the load with arbitrary geometry with a practical upper limit of 40000 points (corresponding to 1 mm point spacing on a grid 20 cm square grid) or more. However, given that the wavelength of B field variation is on the order of 9 cm at 400 MHz in a human load, one point every 1-2 cm should be sufficient to satisfy the sampling criterion.

The present subject matter benefit from added spatial freedom to use in the optimization allowing better conformity to target distributions with sharp variations.

The present subject matter is operable with RF coils with increased numbers of uncoupled radiating elements. These allow additional degrees of freedom increasing the size and dimension of the algorithm's search space.

The present subject matter is not limited to antenna weight design for an x,y directional plane. Weights can be found for skew planes or, more generally, any 3 dimensional volume or surface.

The present subject matter allows for a 'closed loop' imaging process not previously possible. Closed loop imaging involves taking an image of a load using a standard MRI imaging process. From the image, using suitable mathematical manipulation, the $B_{ij}$ matrix can be derived. Using this data as input to the algorithm, antenna drive weights can be calculated improving resolution in parts of the image. Using the improved resolution images, a more accurate $B_{ij}$ matrix can be derived. In turn, more accurate drive weights can be calculated iteratively improving resolution. Designing antenna drive weights closes the loop.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
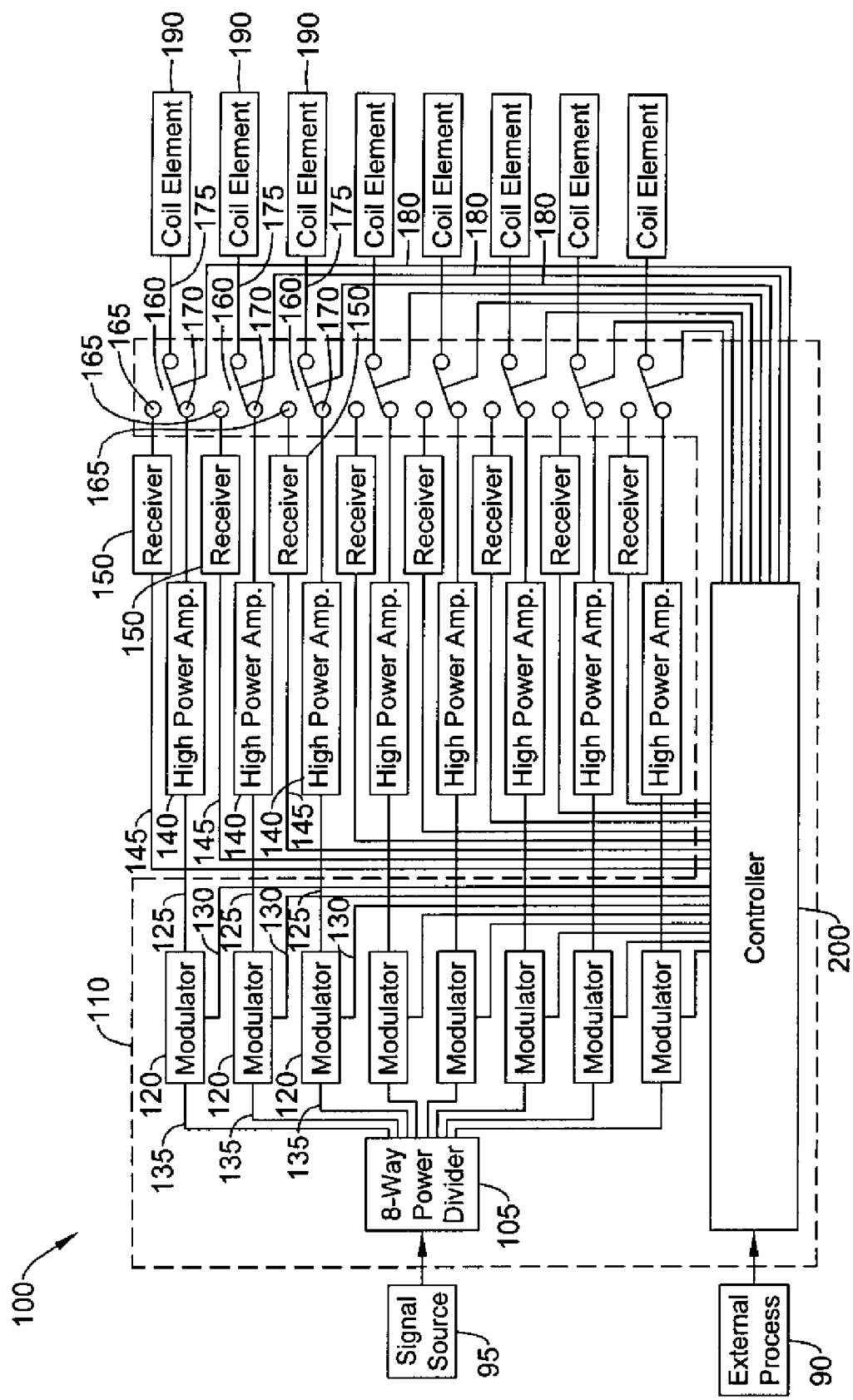
FIG. 1 includes a block diagram of an eight-element transceiver according to one embodiment of the present subject matter.

The present subject matter can be used to control the image intensity variations in high field strength magnetic resonance imaging (MRI) or spectroscopy systems. An increased $B_0$ field strength leads to an improved signal to noise ratio. However, the increased RF field frequency causes $B_1$ field non-uniformity. RF wavelengths of approximately 9 cm can be expected in human anatomy at 9.4 T. Typically, $B_1$ field inhomogeneity is insignificant at low $B_0$ field strengths and is viewed as an error to be corrected as field strength increases. The present subject matter allows $B_1$ non-uniformity to be treated as a tool with which to control $B_1$ field variation. By controlling the $B_1$ field, a localized intensity distribution can be steered to spatially correlate with an anatomic region of interest (ROI).

Preliminary Notes

The detailed description herein includes references to the accompanying drawings, which form a part of the detailed description. The drawings show, by way of illustration, specific embodiments in which the invention can be practiced. These embodiments are also referred to herein as "examples." All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The method examples described herein can be computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, the code may be tangibly stored on one or more volatile or non-volatile computer-readable media during execution or at other times. These computer-readable media may include, but are not limited to, hard disks, removable magnetic disks, removable optical disks (e.g., compact disks and digital video disks), magnetic cassettes, memory cards or sticks, random access memories (RAM's), read only memories (ROM's), and the like.

In one example, the present subject matter includes an algorithm suitable for execution by a processor controlled parallel transceiver. The following section describes one such example of a parallel transceiver.

Parallel Transceiver

A parallel transceiver includes a system to control and monitor multiple parallel channels of a radio frequency coil on both the transmit and the receive side. Each individual current element (or coil element) generates a field based on the current flowing in that current element. The field amplitude, phase, frequency and timing characteristics generated by each coil element is independently controlled by adjusting the current in that current element. Timing control, in one embodiment, allows selection of periods of "on" and periods of "off" time.

The characteristics of the electric current flowing in each coil element is independently determined based on an input signal level and a control signal delivered to a power amplifier or to a modulator coupled to each coil element.

In one embodiment, each resonant current element of a coil is separately addressed and independently controlled based on feedback received using an optimization algorithms.

FIG. 1 illustrates transceiver 100 according to one embodiment of the present subject matter. In the figure, transceiver 100 includes signal source 95 having an output coupled to an input terminal of divider 105. Divider 105 is illustrated as an 8-way power divider, however, this is merely illustrative and other dividers, having more or less ways are also contemplated. For example, in one embodiment a 16-way divider is provided. Divider 105 provides a plurality of output signals, and in the embodiment shown, eight output signals are depicted. The number of output signals corresponds to the division factor of the power divider or splitter. In one example, the divider is part of an interface circuit having an input terminal and a plurality of output signals provided on each of a plurality of output terminals.

Each output signal from the divider, or interface circuit, is separately coupled to input 135 of modulator 120. Each modulator 120 provides an output at terminal 125. In addition, each modulator is further coupled to controller 200 via separate control lines 130. From terminal 125, each modulator 120 is coupled to an input of amplifier 140. In one example, modulator 120 includes an amplifier. In the embodiment illustrated, amplifier 140 includes a high power amplifier. An output of amplifier 140 is coupled to switch 160 at first node 170. Each switch 160 also includes second node 165 coupled to receiver 150. Each receiver 150 is further coupled to controller 200 via receiver output 145. Each switch 160 includes a pole connection at node 175 which is further coupled to coil element 190. Each switch 160 is controlled by a separate control line 180 coupled to controller 200.

In one example, the interface circuit includes, or is coupled to, multiple parallel input signal sources and not with a power divider. For example, multiple independent driving signals are connected in parallel with the interface circuit.

Controller 200, in various embodiments, includes a processor or a signal processor. Controller 200 is coupled to a external processor 90. External processor 90, in one embodiment, is a remote processor and is coupled to controller 200 by an RS-232 interface, an Ethernet, a general purpose interface bus (GPIB) or other connection.

Other control lines coupled to controller 200 are also contemplated. For example, in various embodiments, a control line is coupled to power amplifier 140, receiver 150 and divider 105. In addition, a feedback is provided to controller 200 using one or more control lines or separate feedback lines.

In one embodiment, each receiver 150 is coupled to controller 200 by a signal processor. In one embodiment, the present system is configured to not generate an image in which case a feedback signal from receiver 150 is used to adjust a parameter. For example, in one embodiment, a histogram is generated and an algorithm executed on a processor is adapted to drive the histogram flat.

In one embodiment, the radio frequency transmit signals are relatively small and thus can be readily controlled in terms of phase, frequency and amplitude.

In one embodiment, assembly 110 is provided on a particular structure such as a circuit board or in a chassis.

In one embodiment, a driver and a pre-amplifier are coupled to each coil element. In one embodiment, the amplifier includes a solid state amplifier. In one embodiment, the amplifier includes one or more power field effect transistor (FET) having a device rating of between approximately 150 and 500 watts.

Figure 2:
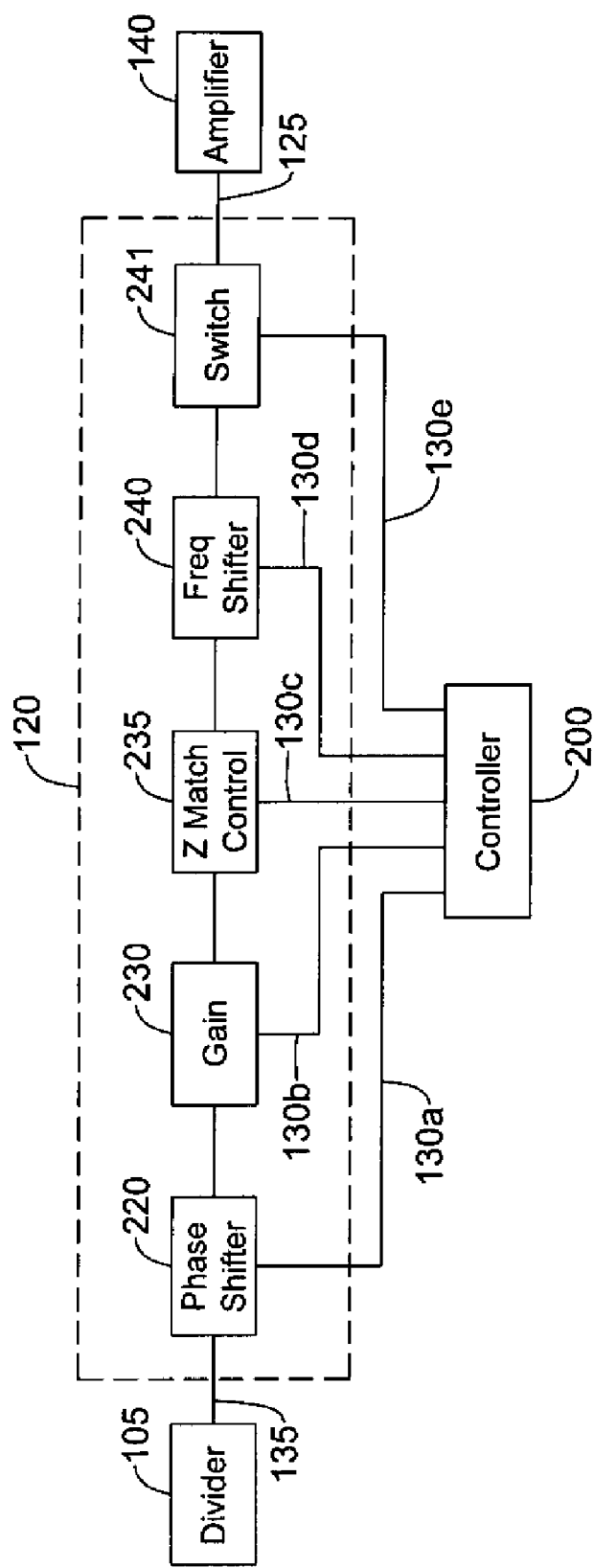
FIG. 2 includes a block diagram of a modulator according to one embodiment of the present subject matter.

FIG. 2 illustrates modulator 120 according to one embodiment. In the figure, modulator 120 includes phase shifter 220, gain 230, impedance match control 235 and frequency shifter 240 in series connection. Other configurations are also contemplated, however the embodiment shown is illustrative. Divider 105 provides a signal on input 135 to modulator 120. Modulator 120 provides an output at terminal 125 which is coupled to amplifier 140. Each of phase shifter 220, gain 230, impedance match control 235 and frequency shifter 240 are coupled to controller 200 via control lines 130A, 130B, 130C and 130D, respectively. Switch 241, also connected in series, provides control for the power delivered to amplifier 140, and thus, the current element. The power for a coil element, in one example, is modulated on and off according to a selected operating parameter. Switch 241 is controlled by control line 130E.

Phase shifter 220, gain 230, impedance match controller 235 and frequency shifter 240, in various embodiments, includes PIN diodes, filters and other active and passive circuit elements. Phase shifter 220 introduces a phase shift as a function of a signal provided by controller 200 on control line 130A. In one embodiment, gain 230 includes a programmable attenuator and is configured to adjust a signal amplitude delivered to amplifier 140. In one embodiment, gain 230 includes a switch to selectively turn on or off an output signal from modulator 120 as a function of a signal on control line 130B. In one embodiment, gain 230 includes an amplifier having a variable gain as determined by a signal on control line 130B. In one embodiment, impedance match control 235 includes an impedance bridge or voractor or other circuit or component to provide feedback and control to match each current element to the load presented. In one embodiment, frequency shifter 240 adjusts the frequency as a function of a signal from controller 200 using control line 130D.

In other embodiments, modulator 120 includes an amplifier gain control to control the amplitude of the radio frequency signal. As indicated in the figure, the modulator is controlled by a control line coupled to controller 200. In one embodiment, a control line is coupled to each power amplifier 140.

Figure 3:
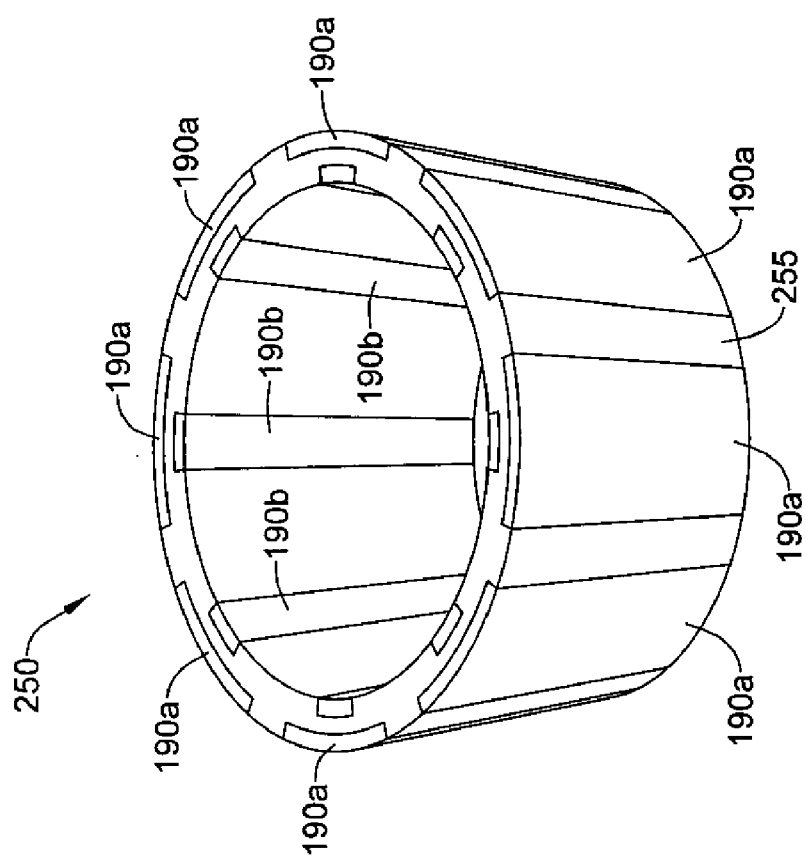
FIG. 3 includes a view of a volume coil according to one embodiment of the present subject matter.

FIG. 3 illustrates multi-element radio frequency coil 250 according to one embodiment of the present subject matter. In the figure, an 8-element coil is illustrated, however more or less elements are contemplated. For example, in various embodiments, coil 250 includes 4-elements, 16-elements and 32-elements. In the figure, coil 250 includes parallel conductive strips arranged concentrically about form 255. Form 255 is fabricated of non-conductive material. Inner conductive strips 190B are illustrated to be of smaller cross-section than that of outer conductive strips 190A.

Referring again to FIG. 1, each switch 160 is coupled to coil element 190 and pursuant to coil 250 of FIG. 3, each switch is coupled to conductive strips 190A and 190B.

Coil 250, is sometimes referred to as a transverse electromagnetic (TEM) coil and in various embodiments, includes multiple strip-lines, micro-strips, or current elements, each element of which can be independently controlled inductively and capacitively to allow control of phase, amplitude, frequency and timing.

Figure 4:
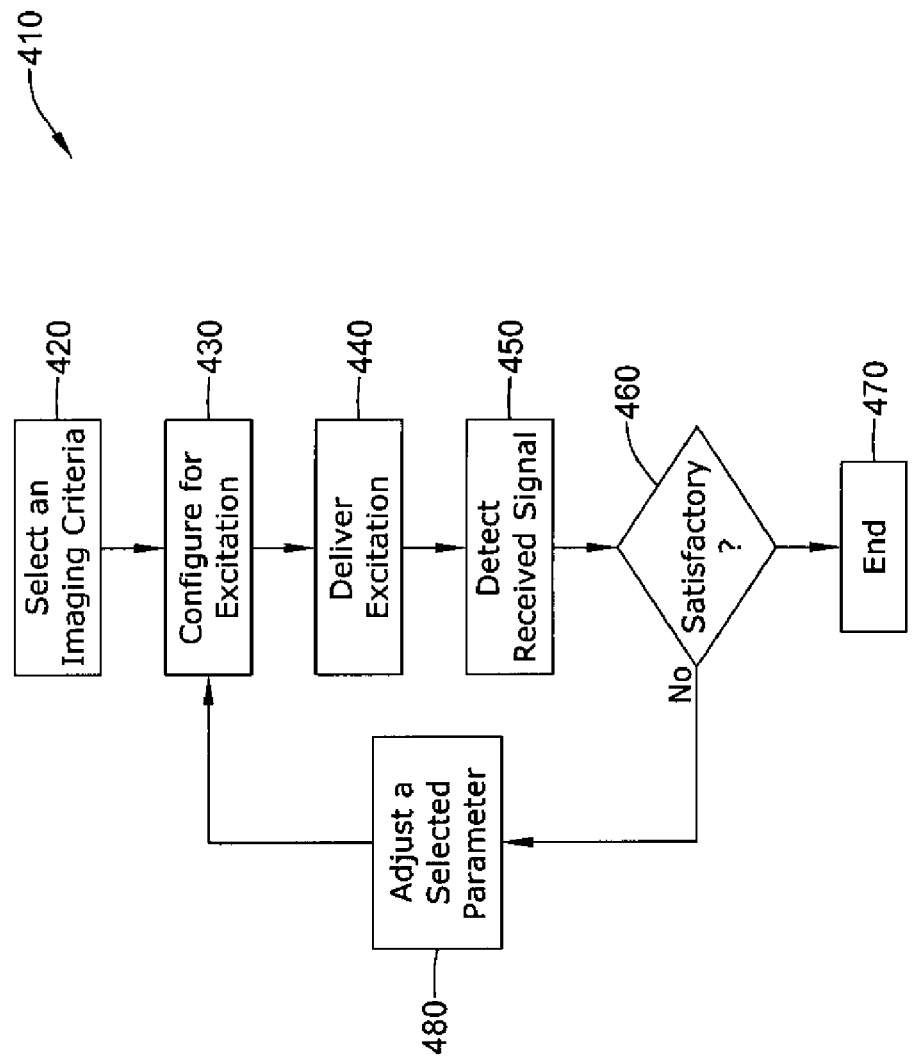
FIG. 4 includes a flow chart of a method according to one embodiment of the present subject matter.

FIG. 4 illustrates method 410 according to one embodiment of the present subject matter. As 420, an imaging criteria is selected. In various embodiments, the imaging criteria may describe a particular signal to noise ratio, image homogeneity, a minimum contrast to noise ratio or may describe a particular region of interest to be examined. In one embodiment, the imaging criteria is selected using a menu or interface presented by a computer. In one embodiment, the imaging criteria is selected automatically by a processor executing instructions stored on computer-readable media.

At 430, transceiver 100 is configured to deliver excitation according to the selected imaging criteria. Configuring transceiver 100, in various embodiments, includes selecting an amplitude, phase and frequency for the current in each coil element 190. In one embodiment, configuring transceiver 100 includes determining when to turn on or turn off a particular coil element 190. In one embodiment, configuring transceiver 100 includes selecting a pulse sequence to be delivered using coil 250.

At 440, an excitation field is delivered to a subject using coil 250. In one embodiment, excitation is delivered by modulating a radio frequency current in each individual coil element 190. Delivering excitation, in one embodiment, entails configuring each switch 160 to provide coil elements 190 with a signal derived from amplifier 140.

At 450, a received signal is detected, again using individual coil elements 190. In particular, the received signal is detected by configuring switch 160 such that a signal received on coil element 190 is coupled to controller 200.

At 460, a query is presented to determine if the image resulting from the received signal satisfies predetermined criteria. If the resulting image satisfies the predetermined criteria, then processing ends at 470. If the resulting image does not satisfy the predetermined criteria, then processing proceeds to 480 wherein a selected parameter is adjusted. For example, in one embodiment, the selected parameter is a current amplitude, in which case, at 480, the amplitude is increased or decreased for a particular coil element 190 as a function of the image generated. Following adjustment of the selected parameter at 480, processing continues by configuring for excitation at 430.

In one embodiment, method 410 is implemented by a processor executing instructions stored on computer-readable media. In various embodiments, the processor includes external processor 90 or a processor of controller 200.

Figure 5:
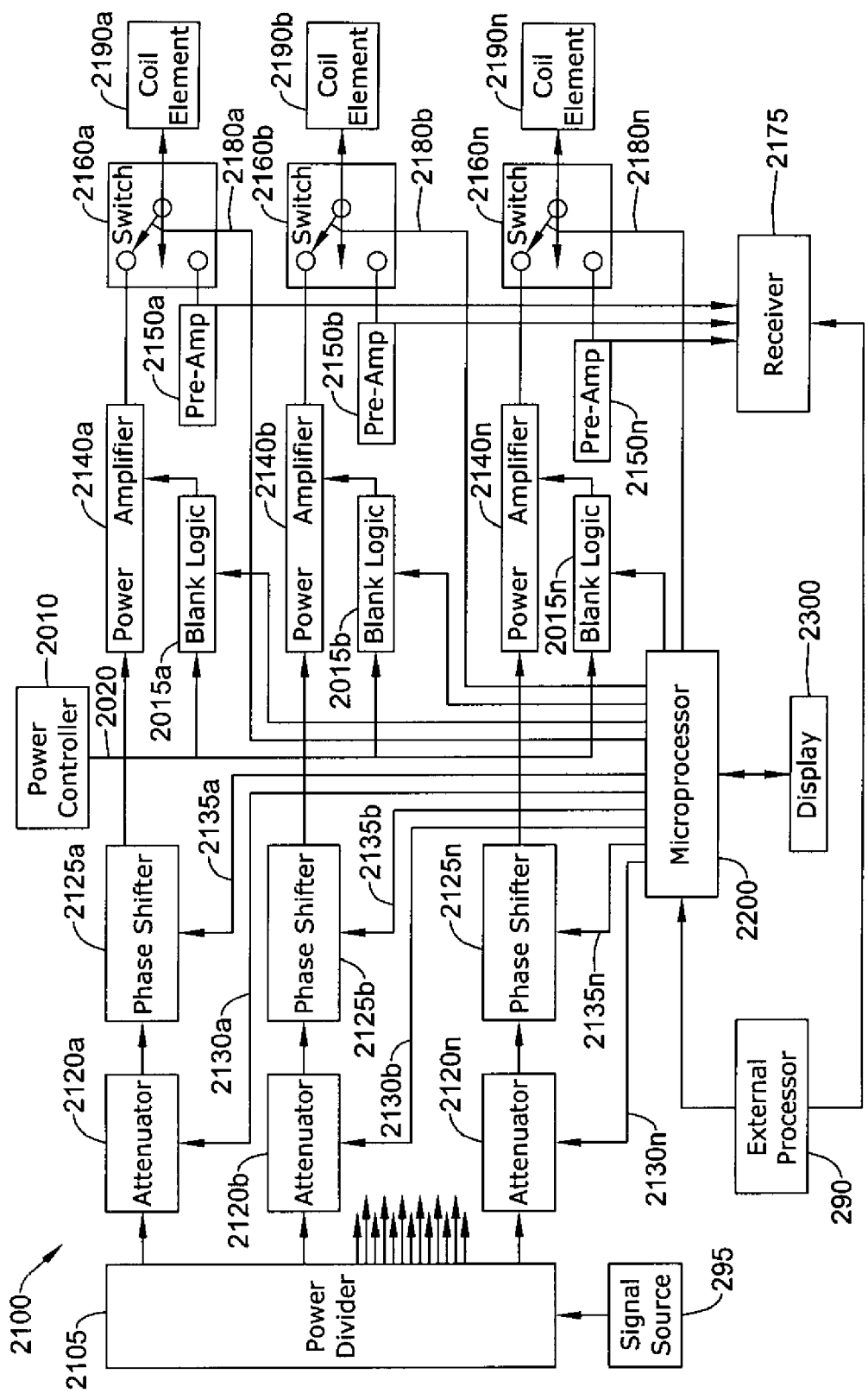
FIG. 5 includes a block diagram of an n-element transceiver according to one embodiment of the present subject matter.

FIG. 5 illustrates transceiver 2100 according to one embodiment of the present subject matter. In the figure, transceiver 2100 includes signal source 295 having an output coupled to an input terminal of power divider 2105. Power divider 2105 is an n-way power divider, where the power is evenly distributed across n output channels. For example, power divider 2105, in various examples, includes an 8-port divider, a 16-port divider or a divider having more or less channels.

Power divider 2105 provides a plurality of output signals, and in the embodiment shown, n output signals are depicted. The number of output signals corresponds to the division factor of the power divider or splitter. Each output signal from power divider 2105 is separately coupled to attenuator 2120A, 2120B to 2120N. In addition, the output from attenuators 2120A to 21020N are coupled to phase shifter 2125A, 2125B to 2125N. Attenuators 2120A to 21020N and phase shifters 2125A to 2125N are configured to modulate the signal from the signal source and are sometimes referred to as elements of a modulator. Each element of the modulator, for example, attenuator 2120A and phase shifter 2125A, are coupled to microprocessor 2200 via lines 2130A and 2135A, respectively. Lines 2130A and 2135A, in various embodiments, provides control of the particular element or provides a feedback signal corresponding to a mode of operation or setting of the particular element.

Power controller 2010 is coupled to blank logic 2015A, 2015B to 2015N, which is, in turn, coupled to power amplifier 2140A, 2140B to 2140N. Power amplifiers 2140A to 2140N receive an output signal from phase shifters 2125A to 2125N and provide an amplified signal to switches 2160A, 2160B to 2160N. Electrical power to power amplifiers 2140A to 2140N is controlled by the combination of power controller 2010 and blank logic 2015A to 2015N.

Switches 2160A to 2160N coupled coil elements 2190A, 2190B to 2190N, to power amplifiers 2140A to 2140N or pre-amplifier 2150A, 2150B to 2150N, respectively. Control of the mode of operation and feedback relative to switches 2160A to 2160N is provided via lines 2180A, 2180B to 2180N, each of which are coupled to microprocessor 2200. Output signals from each of pre-amplifiers 2150A to 2150N are coupled to receiver 2175, which is further coupled to external processor 290. Display 2300 is coupled to microprocessor 2200 and renders graphical or numerical data corresponding to the operation of system 2100.

Figure 6:
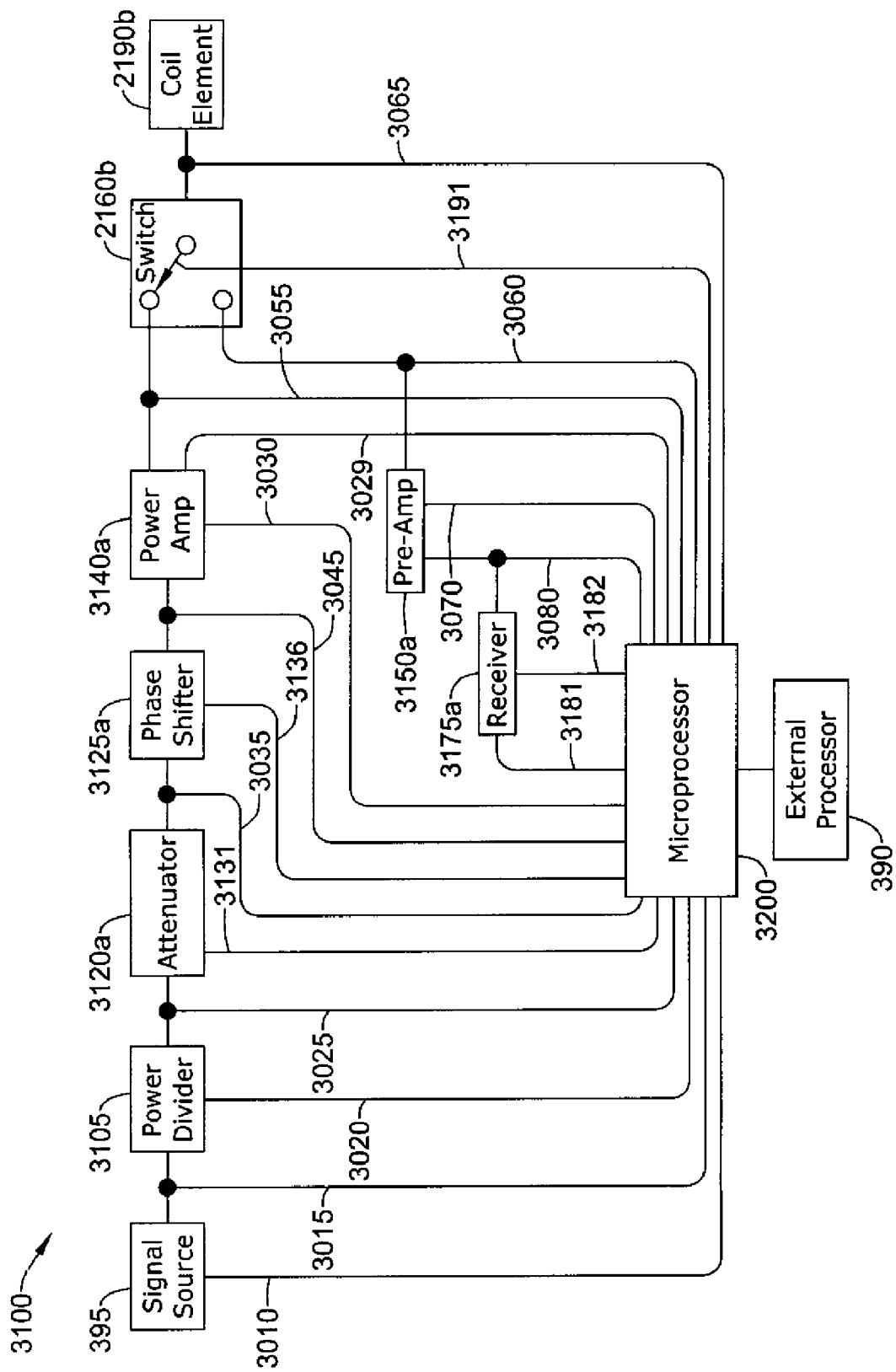
FIG. 6 includes a block diagram of an exemplary element of a multi-element transceiver according to one embodiment of the present subject matter.

FIG. 6 illustrates particular channel 3100 of a multi-channel transceiver, portions of which are depicted in FIGS. 1, 2 and 5. Signal source 395 generates an excitation signal which is provided to power divider 3105. The output from power divider 3105 is coupled to attenuator 3120A which is further coupled to phase shifter 3125A. The output from phase shifter 3125A is coupled to power amplifier 3140A which is further coupled to a first node of switch 3160. A second node of switch 3160 is coupled to pre-amplifier 3150A which is also coupled to receiver 3175A. An output from receiver 3175A is coupled to microprocessor 3200. An output of switch 3160 is coupled to coil element 3190A. Each of signal source 395, power divider 3105, attenuator 3120A, phase shifter 3125A, power amplifier 3140A, pre-amplifier 3150A, receiver 3175A and switch 3160 is coupled to microprocessor 3200 by links 3010, 3020, 3131, 3136, 3030, 3070, 3182 and 3191, respectively. In one example, links 3010, 3020, 3131, 3136, 3030, 3070, 3182 and 3191 each provide a feedback signal as to the mode of operation of the particular element. In one example, a control signal is provided to each element via links 3010, 3020, 3131, 3136, 3030, 3070, 3182 and 3191.

In addition, in one example, signal feedback is provided between each element. For example, feedback lines 3015, 3025, 3035, 3045, 3055, 3065, 3060, 3080 and 3081 provide feedback to microprocessor 3200 as to the signal carried between the particular elements as illustrated. External processor 390 is coupled to microprocessor 3200 and provides additional processing, display and control functions.

Adjusting the phase and the frequency provides control over the individual current elements. In one embodiment, a pulse sequence is delivered to selected current elements of the coil.

The criteria selected for imaging or other application, in various embodiments, includes at least one of any combination of image uniformity and signal-to-noise. In one embodiment, a region of interest is enhanced based on specific criteria, such as contrast. Other algorithms are also contemplated to generate pulses or provide other driving signals.

Feedback present in various embodiments of the present subject matter can be described as relative to the transmit side as well as the receive side of the transceiver. For example, on the transmit side, individual current elements, as well as modulator 120 can provide a feedback signal corresponding to a performance criteria. In particular, in the event of an impedance mismatch between a driver and a load presented, a measure of a reflected signal (standing wave ratio, SWR) on a line can provide a signal to controller 200 to allow re-configuration of the modulator. As another example, feedback as to a measure of total power delivered to coil 250 can be used as a safety mechanism to prevent excessive power delivery to a subject. Other parameters can also be monitored with feedback on the transmit side. For example, the frequency, amplitude and phase of a delivered signal can be monitored to verify that the parameter called for was called for was actually delivered.

On the transmit side, changes in the phase, amplitude and frequency of a given current element provides nearly instantaneous feedback as to the affected magnetic resonance signal. A control signal is generated as a function of the feedback received and is used to modify the transmitter response by changing one or more parameters associated with the driving signal for at least one particular current element of the coil.

In one embodiment, three types of signals are present in transceiver 100 which can be described as radio frequency drive signals, control signals and feedback signals. The radio frequency drive signals, in various embodiments, are manipulated using amplifiers, filters, signal processors and other elements to provide a signal tailored to a predetermined criteria. The radio frequency drive signals are manipulated and controlled using the signals on the control lines and feedback signals. The independent radio frequency transmit and receive signal, along with independent control over independent coil elements, and feedback from selected elements allows a particular region of interest to be targeted or optimized in an nuclear magnetic resonance sample.

In one embodiment, the present system provides multiple radio frequency signal channels for transmitting to, and receiving from, multiple radio frequency coil elements. In one embodiment, the present system provides multiple control signal circuits for independently controlling transmit and receive functions in each of the various current elements of the magnetic resonance radio frequency coil. In one embodiment, the present system provides multiple radio frequency signal feedback loops for sampling radio frequency signals transmitted to, and received from, the multiple radio frequency coil elements. In one embodiment, the present system includes computer readable instructions adapted to adjust a radio frequency signal feedback according to predetermined criteria. In one embodiment, the present system includes transmit, receive, and coil control protocols adapted to achieve predetermined nuclear magnetic resonance data from a region of interest in a sample (e.g. human body) according to predetermined criteria.

In various embodiments, predetermined criteria includes at least one of any combination of signal-to-noise, spatial resolution, spatial location, spatial dimension, spatial uniformity, temporal resolution, timing, duration, various contrast attributes, phase angle and frequency.

The present subject matter is suited for use with magnetic resonance imaging (MRI), magnetic resonance spectroscopy (MRS), functional magnetic resonance imaging (fMRI), electron paramagnetic resonance (EPR), and electron spin resonance (ESR) as well as nuclear magnetic resonance (NMR) and where this document refers to nuclear magnetic resonance, it is understood that others are also included.

The operational (Larmor) frequency for proton imaging increases linearly with field strength. Accordingly, the wavelength decreases, especially in the tissue dielectric. For example, the wavelength in brain tissue at 7 Tesla (300 MHz) decreases to approximately 12 cm. Consequently, human head and body imaging become increasingly non-uniform with increasing field strength. A multi-element coil, according to the present subject matter, provides interactive phase and amplitude control over the independent coil elements and can thus, correct spatial non-uniformities in the image or magnify a predetermined region of interest for additional signal from that region.

In one example, power divider 2105 includes a 16-port zero degree power divider and signal source 295 includes a directional coupler. In one example, attenuators 2120A to 2120N include an 8-bit digital attenuator. In one example, phase shifter 2125A to 2125N include an 8-bit digital phase shifter. In one example, power controller 2010 includes a blank transistor-transistor logic (TTL) array. In one example, power amplifier 2140A to 2140N includes a power field effect transistor (FET) amplifier having a 500 watt rating.

Figure 7:
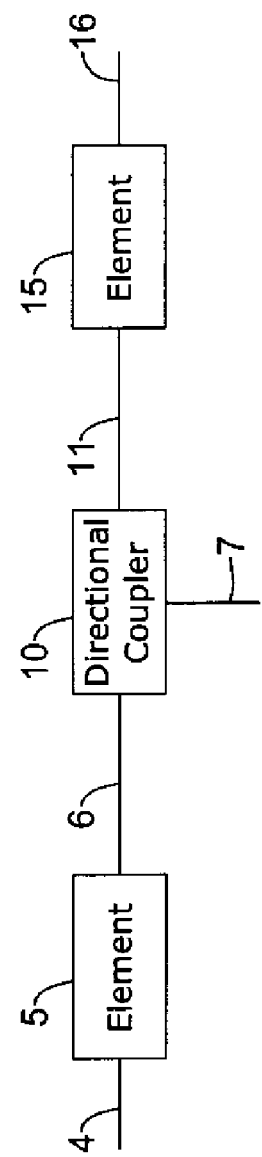
FIG. 7 illustrates a directional coupler in a portion of a circuit.

FIG. 7 illustrates exemplary directional coupler 10 coupled between element 5 and element 15. In the figure, element 5 and element 15 each corresponds to a component or element as described herein. In one example, element 5 represents power divider 3105 and element 15 represents attenuator 3120A. Element 5 generates output signal 6 as a function of input signal 4. In addition, element 15 generates output signal 16 as a function of input signal 11. Directional coupler 10 provides an output, or feedback, signal 7 as a function of signal 6. A directional coupler is but one device for sampling a signal. Other exemplary devices include a PIN diode and an oscilloscope probe.

In one example, an optical converter and an optical fiber are used to couple particular elements. In one example, a radio frequency filter circuit and a Faraday cage are used to isolate selected portions of the circuit.

In various examples, multiple channels are provided, including, for example, 4-channels, 8-channels, 16-channels as well as less or greater numbers of channels.

In one example, the present subject matter includes a multi-channel transmitter configured to provide a multi-channel driving signal to a multi-element radio frequency coil where each current element of the coil is driven by a separate and independently controlled excitation signal. The electrical signal provided by each channel of the multi-channel transmitter is independently controllable.

In one example, the present subject matter includes a multi-channel receiver configured to receive a multi-channel response signal from a multi-element radio frequency coil where each current element of the coil provides a separate and independent output signal. The output signal provided by each channel of the multi-channel receiver is independently controllable and independently, processed, amplified and filtered. In one example, a power modulator, or power controller is provide to adjust the time of powering of a current element.

In one example, the present subject matter includes a multi-channel transmitter and receiver, or transceiver, configured to provide a multi-channel driving signal to a multi-element radio frequency coil and receive a multi-channel response signal.

In one example, the signal source includes a directional coupler which bleeds off a sample of the communicated signal. For example, transmitted power coupled to one port is passively coupled to an output port of the directional coupler.

In one example, multiple signal sources, each operating independently can be coupled to the power divider or splitter.

In one example, power controller 2010 includes a circuit to turn on and off supply current to power amplifiers 2140A to 2140N. Power amplifiers 2140A to 2140N are normally held in a hard off position to reduce noise introduction and selectively turned on when triggered. In one example, power modulation to control on and off cycles of the excitation signal is provided by a separate power modulator as part of modulator 120 of FIG. 1.

In various examples, the present subject matter includes feedback derived from a variety of sources, including, for example, system feedback, signal feedback and processed signal feedback.

System feedback, in one example, includes circuitry and connections to allow microprocessor 2200 to monitor the operation and mode of selected components in the system. For example, link 2180A provides a system feedback signal corresponding to the mode of operation of switch 2160A. The system feedback signal, in one example, provides a signal to indicate that the component or element is operating properly. In various examples, selected components are configured to provide a status signal.

Signal feedback, in one example, includes circuitry and connections to allow monitoring of the signal. For example, signal feedback is derived from a directional coupler which can provide data corresponding to a transmitted or received signal. The signal feedback can include, for example, data corresponding to the phase, frequency, amplitude and on or off state of a particular signal.

As to a transmitted signal, a directional coupler can operate as a signal detector. For example, a small amount of transmitted energy is detected in a forward direction and a reflected (or return) signal is also detectable. In one example, with respect to FIG. 6, the signals on link 3015 and 3025 are provided to microprocessor 3200 by a directional coupler. In one example, a directional coupler is provided between each element of the multi-channel transceiver. The signal feedback provides data corresponding to the settings and status of that particular module. For example, the amount of attenuation provided by attenuator 3120A is discernable based on the signal fed back on link 3035.

In one example, a directional coupler at the output side of switch 3160A, which provides feedback signal 3065, allows monitoring of the excitation signal delivered to coil element 3190A.

Signal feedback provides a tool to verify signal integrity. For example, extraneous and spurious signals can be detected using signal feedback. Signal feedback, in one example, also provides a measure of the reflected power. In addition, signal feedback provides data corresponding to the power delivered to the coil, and thus, allows monitoring for safe levels of power for patient safety and equipment protection.

In one example, a directional coupler is used to provide signal feedback corresponding to a received signal. The directional coupler used to monitor the received signal may be the same or different than that used for monitoring a transmitted signal. In one example, a directional coupler is provided after pre-amplifier 3150A. In one example, feedback from the directional coupler is provided to microprocessor 3200 where programming is executed to adjust system performance based on the feedback signal.

In one example, signal feedback is provided on the receive side. In one example, signal feedback is provided on the transmit side. In one example, signal feedback is provided on both the receive side and on the transmit side. The signal feedback is generated by a directional coupler at any point in the system. In one example, system component feedback is provided.

With respect to the method illustrated in FIG. 4, the feedback signal is detected at 450 and a processor executes an algorithm based on the feedback signal at 460.

Signal feedback provides data corresponding to signal integrity (verification), signal optimization and safety. Signal integrity (verification) provides data corresponding to what signal was actually transmitted or received. If the signal transmitted or received differs from an expected signal, as determined by the processor, then an operating parameter can be adjusted accordingly. Signal optimization relates to an iterative routine, based on signal amplitude, phase, timing relationship or frequency, that allows the operating parameters to be adjusted to achieve desired performance results. Safety relates to how much power is being conveyed to the coil element while transmitting. In particular, safety relates to how much power can the patient safely sustain as well as how much power can the equipment sustain. Sensitive power limited components include, for example, switches and pre-amplifiers. In addition, power levels on the receive side are also monitored by the processor.

Processed signal feedback corresponds to the feedback derived from a processed signal used to make an image or spectral line. In various examples, processed signal feedback is provided to improve the image quality or homogeneity or for other reason. Processed signal feedback, in one example, is implemented as a set of instructions executable by the processor and provides automated adjustment of operating parameters. Processed signal feedback, in one example, is manually implemented to improve image quality or spectra. In various examples, the feedback is interactive or automated.

In one example, all current elements of a coil are driven (transmit side) with an aggregate signal transmitted on a single channel and multiple receive signals processed using multiple channels as described herein. In one example, multiple current elements are driven using multiple channel driving signals (transmit side) and all current elements of the coil are driven with an aggregate signal transmitted on a single channel and the multiple receive signals are processed using multiple channels.

Example 1 includes a system having a processor having a plurality of control lines, a plurality of signal modulators, where each signal modulator having a modulator input, a modulator output and a control input and wherein each control input is coupled to a respective one control line of the plurality of control lines, an interface circuit having an input terminal and a plurality of output terminals, each output terminal coupled to a respective one modulator input, a plurality of switches, each switch having a transmit input terminal, a receive output terminal, a coil terminal and a control terminal wherein each control terminal is coupled to a respective one control line, wherein each coil terminal is configured to couple with a coil element of a multi-element magnetic resonance coil with each coil element corresponding to a respective one coil terminal, and a plurality of receivers, each receiver having coupled to a respective one receive output terminal.

Example 2 includes all of Example 1 and wherein each modulator includes at least one of an amplifier, an attenuator, a frequency shifter, a phase shifter and a power modulator.

Example 3 includes all of any of Example 1 and Example 2 and wherein the power modulator includes a switch.

Example 4 includes all of any of Examples 1 to Example 3 and wherein the interface circuit includes a divider.

Example 5 includes all of any of Example 1 to Example 4 and wherein each receiver includes a signal output and the controller includes a plurality of feedback input terminals and wherein each signal output is coupled to a respective one feedback input terminal.

Example 6 includes all of any of Example 4 to Example 5 and wherein the controller includes a processor adapted to adjust a control signal on a control line as a function of a feedback signal on a feedback input terminal.

Example 7 includes a method including selecting an imaging criteria, configuring a multi-channel transceiver for excitation based on the imaging criteria, wherein each channel of the transceiver is coupled to a respective one of a plurality of current elements of a multi-element radio frequency magnetic resonance coil, delivering excitation to the coil, detecting a plurality of received signals as a function of the excitation, evaluating the received signals as a function of the imaging criteria, and adjusting a selected parameter of at least one channel of the transceiver, each channel controllable independent of any other channel of the transceiver.

Example 8 includes all of Example 7 and wherein adjusting the selected parameter includes adjusting at least one of a phase shift, a frequency, an amplitude and a powered time.

Example 9 includes all of any of Example 7 and Example 8 and wherein evaluating the received signals includes receiving a feedback signal.

Example 10 includes all of any of Example 7 to Example 9 and wherein evaluating the received signals includes evaluating a mode of operation of a component of the transceiver.

Example 11 includes an apparatus comprising an input interface having a plurality of output channels, a processor coupled to the input interface by a plurality of control lines and a plurality of feedback lines, each control line and each feedback line corresponding to a respective one output channel, a plurality of switches, each switch coupled to a respective one output channel and coupled to the processor and further wherein each switch is adapted for coupling to a respective one current element of a multi-current element magnetic resonance coil, a plurality of receivers, each receiver coupled to one switch of the plurality of switches; and wherein the switch is configured to select one of the input interface and the plurality of receivers.

Example 12 includes all of any foregoing Example and wherein the input interface includes a power divider.

Example 13 includes all of any foregoing Example and wherein each feedback line is coupled to at least one directional coupler.

Example 14 includes all of any foregoing Example and wherein each output channel includes at least one of an attenuator, an amplifier, a phase shifter, a frequency shifter and a power modulator.

Example 15 includes all of any foregoing Example and wherein each receiver of the plurality of receivers includes an amplifier.

Example 16 includes all of any foregoing Example and wherein at least one feedback line is coupled to at least one of an attenuator, an amplifier, a phase shifter, a frequency shifter and a power modulator.

Example 17 includes all of any foregoing Example and wherein the input interface includes at least one of a parallel signal source, an 8-port divider and a 16-port divider.

Example 18 includes all of any foregoing Example and wherein the output channel includes an impedance controller.

Example 19 includes all of any foregoing Example and wherein output channel includes a field effect transistor power amplifier.

Example 20 includes all of any foregoing Example and wherein at least one control line is coupled to a digital gain controller.

An excitation and detection circuit having individually controllable elements for use with a multi-element radio frequency coil. Characteristics of the driving signal, including, for example, the phase, amplitude, frequency and timing, from each element of the circuit is separately controllable using small signals. Negative feedback for the driving signal associated with each coil element is derived from a receiver coupled to that coil element.

Other examples of the present subject matter are also contemplated, including the following:

Example 21 includes a system having a magnetic resonance coil having a plurality of individually controllable segments, a multi-channel driver, each channel of the driver coupled to a segment in one to one relation, a processor coupled to the driver and configured to control the coil, and a set of instructions executable by the processor, the set of instructions configured to execute a convex optimization algorithm.

Example 22 includes all of Example 21 and wherein the set of instructions are configured to obtain at least one of a uniform B1 field distribution, a localized B1 field distribution, a masked B1 field distribution, a custom B1 field distribution, minimized specific absorption rate (SAR), and a localized SAR.

Example 23 includes all of any of Example 21 and Example 22 and wherein the algorithm is executed over a selected region.

Example 24 includes all of any of Example 21 to Example 23 and wherein the selected surface includes an arbitrary three-dimensional surface or volume.

Example 25 includes all of any of Example 21 to Example 24 and wherein the algorithm includes a closed loop feedback iterative procedure.

Example 26 includes all of any of Example 21 to Example 25 and wherein the processor provides time varying modulation of phase and magnitude using a convex optimization procedure.

Example 27 includes a method comprising receiving a target field distribution for a transverse magnetic field within a coil for use in magnetic resonance imaging (MRI), executing a convex optimization algorithm to determine a solution corresponding to the target field distribution, and selecting a drive signal for a current element of the coil based on the solution.

Example 28 includes Example 27 and wherein selecting the drive signal includes selecting at least one of a phase, a magnitude, and a frequency.

Example 29 includes any of Example 27 and Example 28 and wherein receiving the target field distribution includes receiving at least one of a uniform distribution, a localized distribution, and a masked distribution.

Example 30 includes any of Example 27 to Example 29 and wherein executing the convex optimization algorithm includes executing a program on a computer.

Example 31 includes any of Example 27 to Example 30 and wherein executing the convex optimization algorithm includes minimizing a specific absorption rate (SAR).

Example 32 includes any of Example 27 to Example 31 and wherein executing the convex optimization algorithm includes achieving a localized specific absorption rate (SAR).

Example 33 includes any of Example 27 to Example 32 and wherein receiving the target field distribution includes receiving a distribution for a three-dimensional surface.

Example 34 includes any of Example 27 to Example 33 and wherein receiving the target field distribution includes receiving a distribution for a volume.

Example 35 includes any of Example 27 to Example 34 and further including iteratively repeating the executing and selecting.

Example 36 includes any of Example 27 to Example 35 and wherein selecting the drive signal includes selecting a time varying signal.

Example 37 includes any of Example 27 to Example 36 and wherein selecting the drive signal includes selecting a spatial position for the current element.

Context

The wavelength in the human brain at the 400 MHz Larmor frequency for 9.4 T is approximately 9 cm. At these field strengths, this wavelength leads to pronounced B1 field contours and consequential image inhomogeneity. By controlling $B_1$ gradients over a volume, the present subject matter allows for steering of a constructively interfering field node to spatially correlate with an anatomic region of interest. The present subject matter includes technology for independently controlling the phase, magnitude, frequency, time and spatial parameters of TEM current elements in a transmit head coil to target a local region of interest with a desired $B_1$ distribution.

For high field MRI, the degradation of $B_1$ field homogeneity presents a problem. By controlling the field gradients, images of selected regions of interest can be optimized for higher signal to noise ratios, lower power deposition (SAR), and other criteria.

In one example, a 16-element, 9.4 T, head TEM coil is tuned to approximately 400 MHz by the finite element method (FEM). The data herein includes simulations using a centrally located cylindrical phantom. The coil rung-to-rung diameter is 28.8 cm, shield diameter 34.5 cm and rung length is 17.8 cm. The phantom diameter is 20 cm, length 20 cm, relative permittivity 81 and conductivity 2 S/m. Simulations with each rung driven independently are performed to determine the phantom response to individual drives.

The RF field ($B_1$) at a point in the phantom due to $n^{th}$ current element is broken into x and y components where the x component value is denoted $B_{1\,xn} = A_n e^{j(an+\phi_n)} a_{nx} e^{jb_{nx}}$, where $A_n$ and $\phi_n$ represent the $n^{th}$ element's current amplitude and phase, w, is the Larmor Frequency, and the term $a_{nx} e^{jb_{nx}}$ describes the remainder of the steady state geometrical phase shift and amplitude relation between the $n^{th}$ drive and the x direction $B_1$ magnitude at a given point in the phantom. A similar equation can be written for the y component of the RF field. The final x and y directional $B_1$ field can then be calculated as the sum over n of $B_{1\,xn}$. The overall field is found from these two quantities. Using the finite element simulations, the quantities $a_{nx}e^{jb_{nx}}$ and $a_{ny}e^{jb_{nx}}$ are found for each point on a grid in the phantom placed on the selected field of view and for each current element on the coil. The linear any and $b_{ny}$ values extracted from simulation are shown in FIG. 10. The values within the load are of interest and values throughout a slice of the simulation space are shown. With this information, field distributions can be calculated from arbitrary elemental current amplitudes and phase.

Figure 10A:
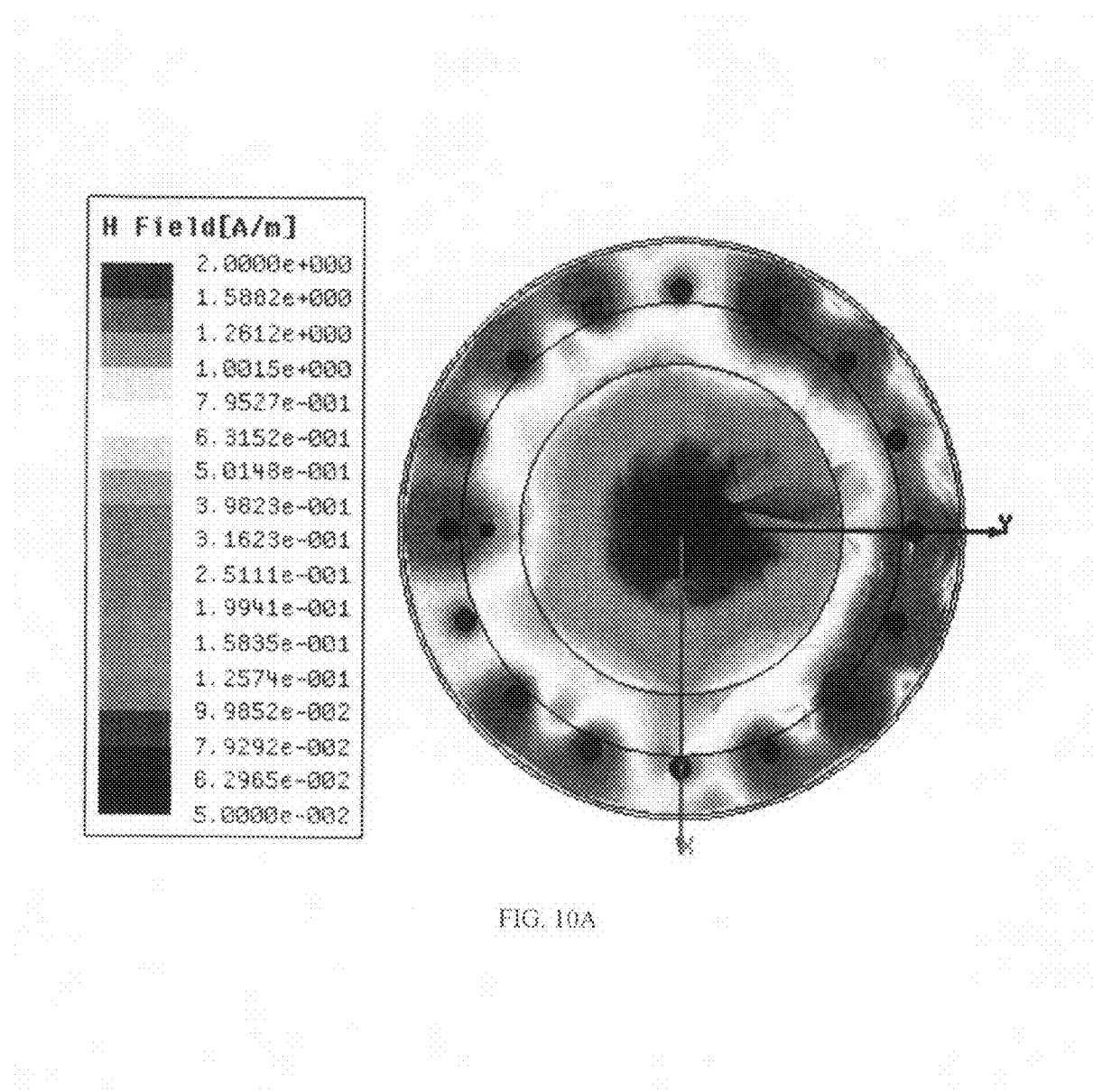
FIG. 10 illustrates results using an TEM coil model.
Figure 10B:
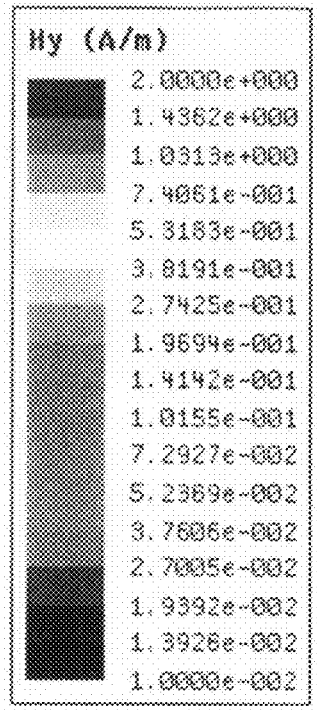
Figure 10B:
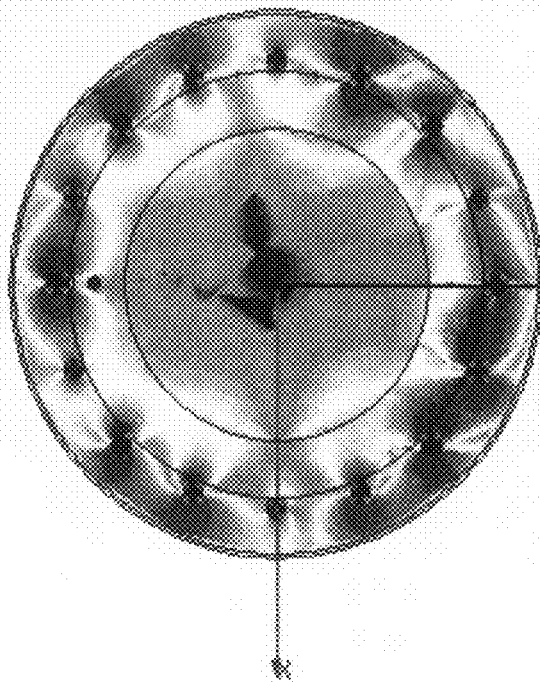
Figure 10C:
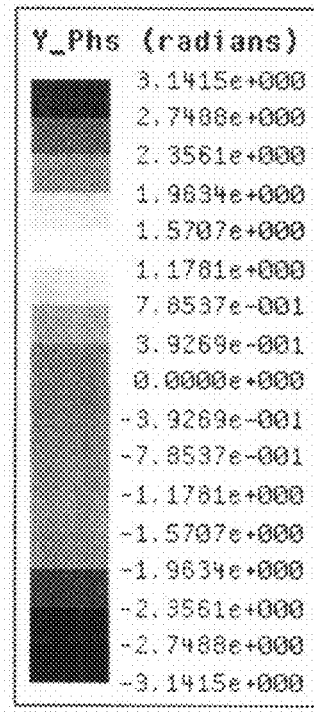
Figure 10C:
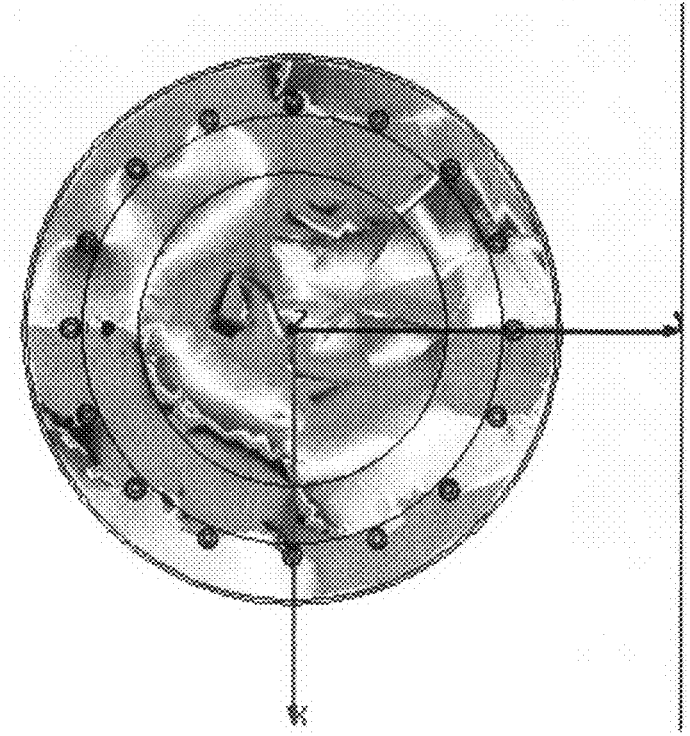

FIG. 10A shows total $B_1$ field, FIG. 10B shows Y-Directioned $B_1$ field and FIG. 10C shows Y directional field phase.

Each $A_n$ and $\phi_n$ is chosen to obtain a distribution approximating a desired field contour. In one example, a cost function is used. The cost function is defined for the distribution fit to the desired field, and to apply an iterative optimization algorithm.

Figure 14:
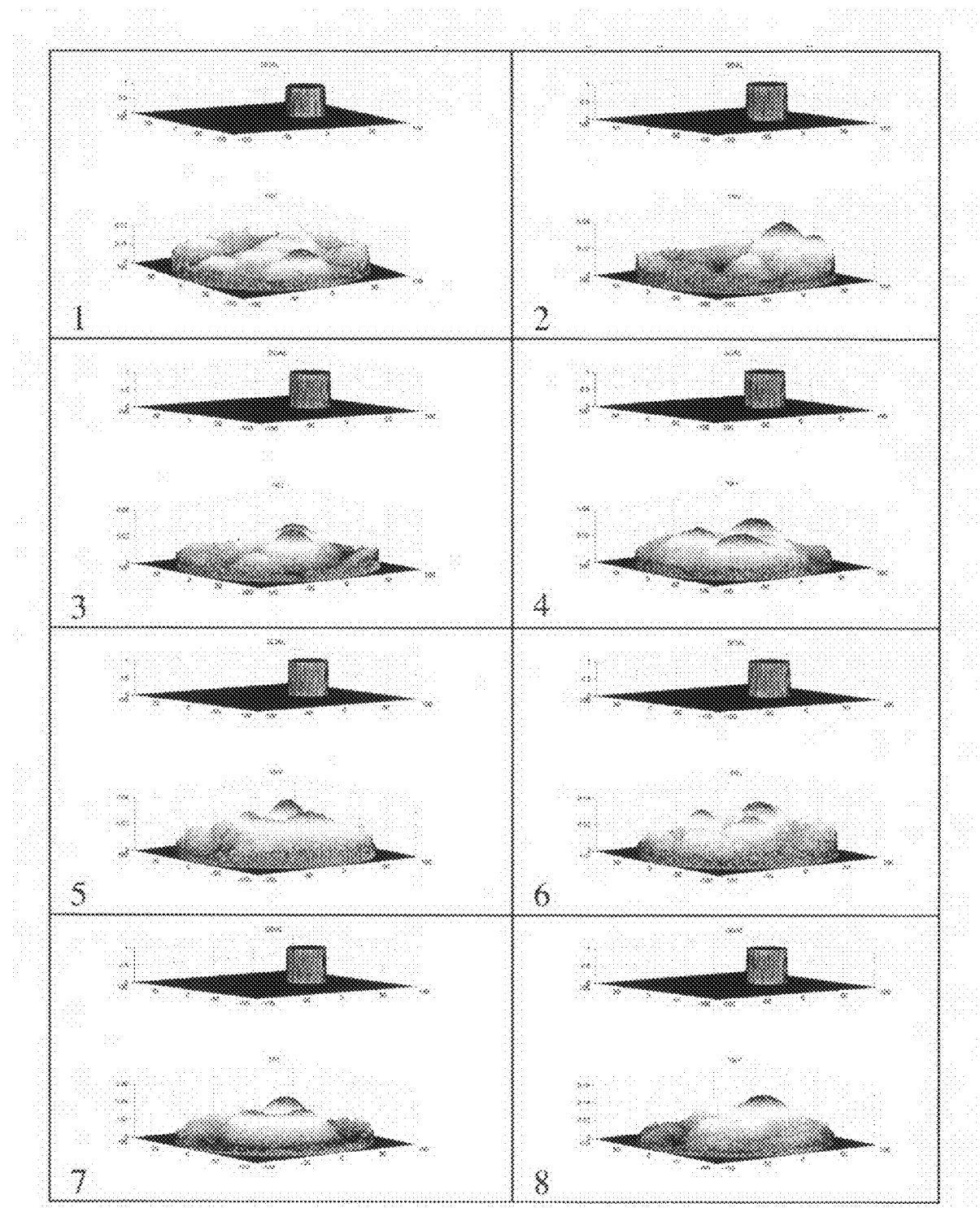
FIG. 14 illustrates simulation results showing convergence to a contour.

Simulation results are shown in FIG. 14 and illustrate a convergence to an arbitrarily chosen, off axis $B_1$ contour reached through current element phase and magnitude control. Successively improving matches, as calculated by sum of least squares difference, are shown sequentially in panels 1 through 8, demonstrating the algorithm's convergence to a solution improvement as compared with a uniform field. The figure shows $B_1$ magnitude optimization showing the simulated annealing approach. Optimization was done for 16 line currents varying both phase and magnitude of each drive element. The field was optimized over a centrally located slice of a phantom to match the target distribution shown in the upper half of each plot.

One example of the present subject matter includes automated $B_1$ field localization of anatomic regions of interests.

$B_1$ magnitude of a single drive resonant head coil with centrally located phantom.

Figure 8:
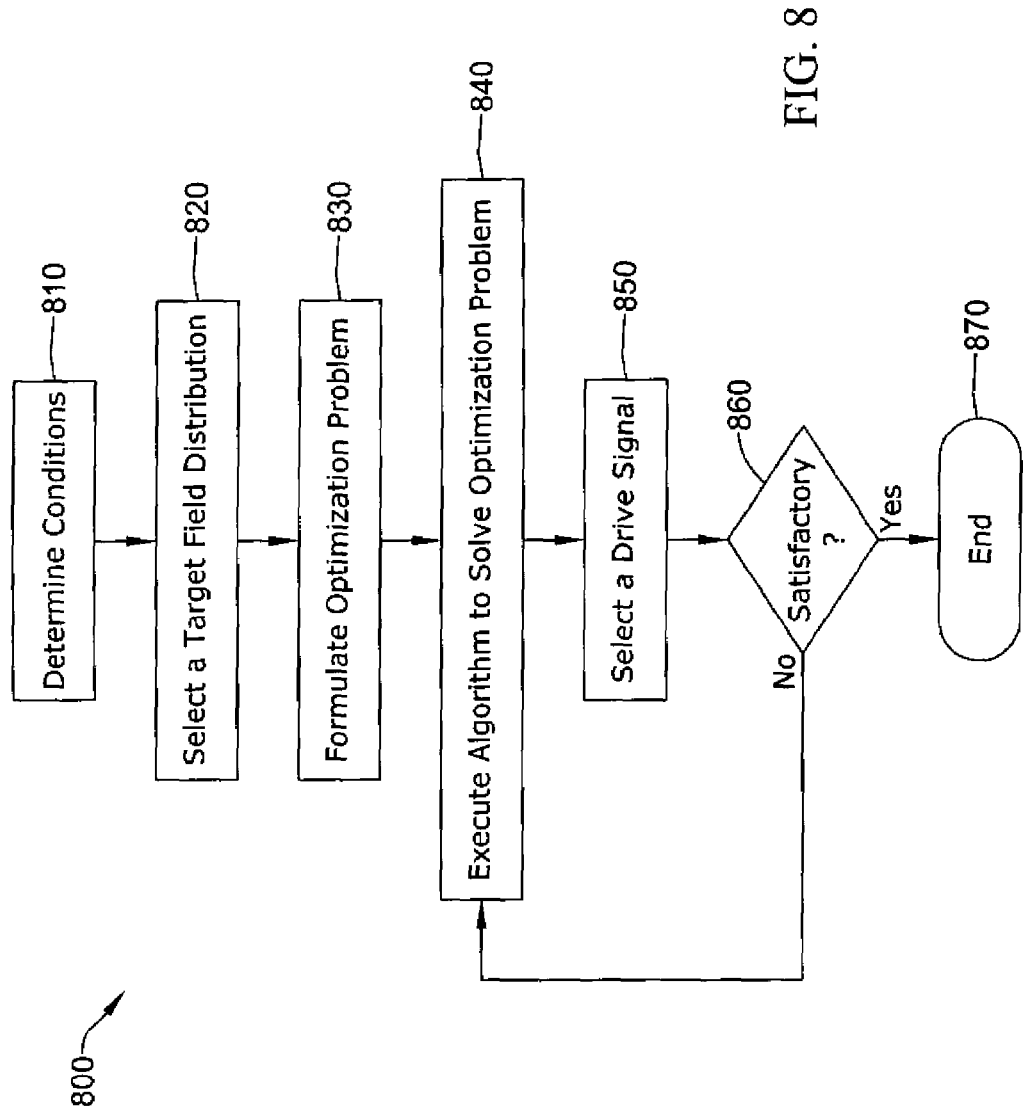
FIG. 8 illustrates a flow chart for implementing field localization.

FIG. 8 illustrates a flow chart of method 800 executed by one example of the present subject matter. At 810, the conditions are determined. These conditions may describe the initial conditions under which the coil and region of interest are configured. The conditions can include information regarding tissue loading or other artifacts that affect imaging performance.

At 820, the target field distribution is selected. For example, the field may be selected to exhibit field homogeneity with or without a particular load in position. In one example, the field is selected to improve signal to noise ratio at a particular region of the image space. Other custom field distributions are also contemplated.

At 830, the optimization problem is formulated as described elsewhere in this document.

At 840, an algorithm is executed to solve the optimization problem. The optimization problem can be a convex optimization problem. The algorithm can be implemented in executable software for use on a processor, workstation or computer.

At 850, a drive signal is selected based on the solution to the optimization problem. Selecting the drive signal can include determining a phase, a frequency, an amplitude (gain), a time and a position for a current element (or a group of current elements) of a coil.

At 860, a determination is made as to whether the field distribution is satisfactory. This can include checking image quality or other performance parameter. If not satisfactory, then, in one example, processing returns to executing an algorithm to solve an optimization problem followed by selecting a drive signal.

Method 800 is but one example and others can be developed based on the disclosure herein.

Introduction

The present subject matter includes a system and method to control the image intensity variations in high field strength Magnetic Resonance Imaging (MRI) systems. An increased $B_0$ field strength leads to an improved signal to noise ratio. The increased RF field frequency causes $B_1$ field non-uniformity. RF wavelengths of approximately 9 cm can be expected in human anatomy at 9.4 T. Typically, $B_1$ field inhomogeneity is insignificant at low $B_0$ field strengths and is viewed as an error to be corrected as field strength increases. The present subject matter allows control of $B_1$ field, in order to steer a localized intensity distribution to spatially correlate with an anatomic region of interest (ROI).

In a parallel RF transceiver system, individual antenna elements (RF coil elements) are driven independently. Each of these antenna elements generate the $B_1$ RF field. By controlling the phase and magnitude of the RF power at each antenna element, the phase and magnitude of the $B_1$ field excited by that antenna element can be controlled. An example of the present subject matter is configured to use convex optimization techniques to design or select antenna element weights that would excite desired $B_1$ field distributions.

In one example, convex optimization is used since solutions to problems formed in a convex way are globally optimal if they exist. Arbitrarily accurate solutions can be obtained because rigorous error bounds exist for problem solutions through duality theory. In addition, convex optimization is calculable via efficient interior point method software. Efficient solutions allow the present subject matter to be used with living human subjects because of the limited time between patient movements.

Localization Problem

RF field parameters can be tailored for optimization. For example, the present subject matter can be configured to provide a uniform RF field distribution in human anatomy at high field. Formulation of the uniform problem can lead to NP-Hard (Nondeterministic Polynomial-time hard) problem formulations with poor solution techniques available to solve such problems. A convex relaxation of the uniform problem does not provide good particular results.

Magnetic Resonance Imaging Physics and Signal Processing—NMR

The Nuclear Magnetic Resonance (NMR) phenomenon is rooted in the quantum mechanical theory of spin. Spin is the angular momentum possessed by a charged particle. The angular momentum of the charged particle causes a magnetic dipole. The charge can be viewed as distributed over the volume of the particle. When this distributed charge rotates at a very high rate of angular velocity, a magnetic dipole is generated as predicted by Ampere's law. The particle often used in MRI is the hydrogen proton ($H^1$), although the nuclei of other elements can also be used. To image a sample, it is placed in a static magnetic field, termed the $B_0$ field in NMR.

In practice this field is generally created with a superconducting solenoidal magnet. The spin dipole magnetic moments align with the $B_0$ field which is defined to be in the $\hat{z}$ direction.

A second field, the $B_1$ field, is generated using a radio frequency excitation of antennas near the sample. The antennas are oriented in such a way as to introduce $B_1$ field transverse to the $B_0$ field. Initially, the $B_1$ field is perpendicular to the magnetic moments and creates a torque on the spinning dipoles. Because of the conservation of spin angular momentum, the dipole experiences a rotational force in the direction perpendicular to the $B_0$ and $B_1$ field.

If the $B_1$ field is made to be sinusoidal, that is $\hat{x} \cdot B_1 = \mathfrak{R}(|B_1|e^{jwt})$ and $\hat{y} \cdot B_1 = \mathfrak{I}(|B_1|e^{jwt})$, the $B_1$ field can be maintained perpendicular to the rotation of the magnetization vector of the spin dipole magnetic moments. The Larmor frequency, w is important to maintaining a perpendicular force and depends on the relativistic quantum mechanics of the spinning proton. The Larmor frequency is $\gamma$=42.58 MHz/Tesla of static field for $H^1$.

To appreciate the orientation of the fields, it helps to use a rotating frame of reference. Suppose there exists a new right handed three dimensional ortho-normal coordinate system with axes x', y', z'. Let $\hat{z}'=\hat{z}$ and $\hat{x}'=\hat{B}_1$. Since the $\hat{B}_0$ vector is always in the $\hat{z}'$ direction in this frame, the magnetization vector M will remain (in the absence of de-phasing) in the y'-z' plane. The amount of rotation from the z0 axis is a function of the magnitude and duration of the $B_1$ excitation. The angle the magnetization vector makes with the z' axis is named the flip angle. In the lab frame of reference the magnetization vector is still rotating about the z axis and is said to be in precession.

Immediately after the magnetization vector is excited to a particular flip angle and the excitation ceases, it begins to relax to it's previous orientation. There are two processes by which the magnetization relaxes to align with the $B_0$ field. The first is the reverse of the process in which the precession was excited. The precession decays and RF field is reradiated from the sample. The reradiated field is the return signal that is used to determine the image. The second process is called de-phasing and occurs because the super-conducting magnet is not perfectly homogenous. Slightly different Larmor frequencies result across the sample and the spins de-phase with respect to each other. When this happens the signal begins to cancel and is not able to be read and used for an image.

The time constant of the exponential relaxation in the z direction is called $T_1$, while the time constant of the relaxation in the x and y direction is $T_2$. The behavior of the magnetization vector in the presence of a $B_0$ field, $B_1$ field, $T_1$ relaxation and $T_2$ relaxation were described by Felix Bloch in the Bloch equations.

$$\frac{\partial M_{x'}}{\partial t} = (\omega_0 - \omega)M_{y'} - \frac{M_{x'}}{T_2} \quad (2.1.1)$$

$$\frac{\partial M_{y'}}{\partial t} = (\omega_0 - \omega)M_{x'} + 2\pi\gamma B_1 M_z - \frac{M_{y'}}{T_2} \quad (2.1.2)$$

$$\frac{\partial M_z}{\partial t} = -2\pi\gamma B_1 M_{y'} - \frac{M_z - M_{z0}}{T_1} \quad (2.1.3)$$

Here, $M_{z0}$ is determined by the magnitude of $B_0$, $w_0$ is the Larmor Frequency and w is allowed to be different from $w_0$ because of gradient excitations.

Gradients

Thus far, the $B_0$ field of the super-conducting magnet has been the only static field acting on the magnetization vector. To perform imaging however, quasi-static gradients are used. They are said to be quasi-static because for the time that they are on or off, they are unchanging, however they may change during the periods of transition between states. Only three gradients are necessary to perform an imaging sequence, however others are also commonly used to correct $B_0$ field inhomogeneity. The field generated by these gradients take the mathematical form $\hat{z}G_x x$, $\hat{z}G_y y$ and $\hat{z}G_z z$ and contribute to the $B_0$ field. It should be noted that (x, y, z)=(0, 0, 0) is called the isocenter of the magnet and is typically where the sample is loaded because it contains the most homogeneous $B_0$ field in the magnet.

To see how these gradients are useful, imagine that $G_z$ takes on some positive value. The resonance frequency is now given by $$w = \hat{z} \cdot B_{static} \gamma \quad (2.2.4)$$

$$w = |B_0 + G_z z|\gamma \quad (2.2.5)$$

and is a function of z position.

Consider that a single frequency $B_1$ excitation is driven. Because of the Z gradient, the Larmor frequency is only matched at a single X-Y slice of the sample corresponding to z=0. This process is called slice selection. Because the RF field is only being excited for a fixed amount of time, the slice has a finite spatial thickness because the Fourier transform of the RF signal has some bandwidth. Resonance will be achieved at all frequencies in this bandwidth and hence a slice with spatial thickness will be excited. In practice, the RF pulse envelope is shaped to be a sinc function (apodized) so that, when Fourier transformed, a square wave of frequencies is excited and a z direction slice with sharp edges is selected.

With the addition of the slice selection $G_z$ gradient pulse, disparate points in the z direction can be resolved, but not objects within the same X-Y plane. To achieve this, the concept of K-Space is used.

First, the reception of the reradiated signal is presented. Consider that a slice selective RF pulse has excited an X-Y slice of the sample with a $\pi/2$ flip angle. In order to receive the return signal, the transmit RF power is instantaneously ceased and the receiver is simultaneously engaged. The Transmit/Receive (T/R) switch, used to protect the receiver from the transmitter power must also be switched in this instant. This is not possible because the RF transmitter has a ramp down time, the T/R switch has a limited response time and the receiver must be enabled.

Instead, the signal is allowed to play out while the transmitter is switched off, the T/R switch turned on and the receiver is prepared at a reasonable pace. The signal dephases and no longer produces the RF signal, however the magnitude of the individual precessions decay much more slowly. After a period of time $\Delta t$, a RF pulse with a flip angle of $\pi$ is driven. The result of this is that the direction of the de-phased magnetic moments are all negated in the x'-y' plane. Now, the de-phased moments that were ahead of the average precession rate are behind the average precession. The slower dephased moments are now in front of the mean precession. The rates of precession are unchanged so the quickly processing magnetic moments will catch up with the mean precession. Likewise, the slowly processing magnetic moments are ahead of the mean precession and as a result will be caught by the mean precession.

At time $2\Delta t$ the de-phased precessions are re-phased and a coherent signal is again obtained. The transmitter is then shut off, the T/R switch set to receive and the receiver is enabled and at this time, $2\Delta t$, the signal is received. As will be seen, this period of time is not only used to switch from transmit mode to receive mode, but is also used to prepare K-Space for read out.

K-Space

K-Space is introduced through the gradient pulse sequences. If there is a constant propagation delay and no attenuation from each of the points in the sample to the receiver, the received signal will be $$\int\int M(x,y) dA \qquad (2.3.6)$$

after dropping a complex constant term. Here $M(x,y)$ is redefined as $M_x(x,y)+jM_y(x,y)$, the complex magnetization vector processing at the Larmor frequency associated with the $B_0$ field and $dA$ is a differential area of the slice selected by the slice selection gradient during RF excitation.

Consider that the value of $G_x$ is set to a positive constant during read out. The result is that precessions that were excited during the RF pulse will process at a new Larmor frequency depending on the x location in the sample. Under the constant propagation delay and the constant attenuation condition introduced previously, the received signal is then $$\int\int M(x,y) e^{j\gamma G_x xt} dA \qquad (2.3.7)$$

Let $t=0$ be the moment the readout gradient (X gradient) is turned on and the signal is received. The positive x direction spatial frequencies of the imaged sample can be directly sampled as time progresses.

The Fourier space can be directly measured in the MRI system. A sufficient amount of the Fourier space (called K-space in the context of MRI) is collected to obtain a reasonable reconstruction after a two dimensional inverse Fourier transform is preformed. From this the $M(x,y)$ distribution that generated the signal is collected. There are two problems with the previous example that will prevent collection of the entire frequency space. First, only positive x spatial frequencies are collected. Second, there is no means of collecting they direction spatial frequency components. Both of these issues may be resolved. In order to read negative spatial frequencies in x, the $G_x$ gradient is set negative before the readout, and after the RF excitation. $G_x$ is set positive during the readout as before. Stated mathematically, the new received signal will be $$\int\int M(x,y) e^{j(\gamma G_x xt + \int_{-2\Delta t}^{0} \gamma G_x t dt)} dA, \qquad (2.3.8)$$

where 0 in the integral corresponds to the beginning of the readout. Conceptually, this will move the Fourier space starting point into the negative spatial frequency region. The read out gradient will then proceed positively to zero and then to positive spatial frequencies. In this manner, all x direction spatial frequencies can be read. In practice only a limited number of spatial frequencies are needed to achieve a reasonable reconstruction of the image. To read y direction spatial frequencies, the technique of presetting k space for read out is again used. Here instead of using a negative x gradient, a positive or negative y gradient will be used to preset the read out. Mathematically, the new received signal is of the form:

$$\int\int M(x,y) e^{j(\gamma G_x xt + \int_{-2\Delta t}^{0} \gamma G_x t dt + \int_{-2\Delta t}^{0} \gamma G_y y t dt)} dA. \qquad (2.3.9)$$

With a the combination of these two techniques, Fourier space can be preset to any position and readout will then progress in the positive x spatial frequency direction. The spatial frequency value of the sample in Fourier space is then directly sampled from the RF field. As time progresses in the readout, increasing x spatial frequencies are read. The pulse sequence can then be repeated at many values of Y direction spatial frequency offset. This provides directly measured values of the Fourier space of the imaged sample. The inverse Fourier transform can then be evaluated and displayed as the image.

Mathematical Formulation of the Localization Problem

Convex Optimization

Convex optimization is an efficient method for calculating globally optimal solutions on computer equipment in reasonable amounts of time. This technique is able to accomplish these results because of the limitations imposed on the structure of problems that it is capable of addressing. First, convex problems must have convex constraint sets. This means that points along a line between any two points in the feasible set must also be in the feasible set. Sets shaped as spheres and ellipses possess this property while sets shaped as stars and toroids do not. The second necessary condition is that the optimization objective functions must be convex.

Again, this means that the objective function's second derivative are positive at all points. Equivalently, all points lying on a line between any two points on the surface of the range of the function have a greater value than that of the function at that point.

Convex optimization is able to achieve efficient and optimal solutions because of the limitations that are placed on the types of problems that it is able to address. Thus, the challenge lies in formulating the problem to be solved in a convex way. After formulation, a convex optimization problem can be solved using software executing an algorithm on a computer or processor.

Mathematical Formalism

This section describes a convex formulation of the localization problem. Let $B_1^t$ be the three dimensional time harmonic magnetic flux density in the load caused by the RF coil during the RF excitation phase of the FLASH imaging sequence. Here, $^t$ represents transmit, not transpose which will be denoted as $^T$. The z directional portion of this field will be neglected as it is small compared to the $B_0$ field and will be approximated to be zero, i.e., $\hat{a}_z \cdot B_1^t \approx 0$. New functions $B_{1,x}^t$ and $B_{1,y}^t$ are defined as $$B_{1,x}^t \hat{a}_x \cdot B_1^t \qquad (3.2.1)$$

$$B_{1,y}^t = \hat{a}_y \cdot B_1^t, \qquad (3.2.2)$$

the x and y directional components of the $B_1^t$ field respectively. If the space in the load is discretized into m positions, $B_{1,x}^t$ and $B_{1,y}^t$ (functions of position) may be listed in vectors $B_{1,xi}^t$ and $B_{1,yi}^t$ where the $i^{th}$ row corresponds to the $i^{th}$ position of m in the load. In a parallel transceiver system, each of these rows can be further separated into components caused by each of n antennas in the RF coil array by linear superposition theory. The result are the matrices $B_{1,xij}^t$ and $B_{1,yij}^t$ where the $j^{th}$ column corresponds to the $j^{th}$ of n antennas in the parallel transceiver coil. The net positively polarized transmitted field is then defined as $$B_1^{t+} = B_{1,x}^t - jB_{1,y}^t. \qquad (3.2.3)$$

As a result of this formulation, $B_1^{t+} \in \mathbb{C}^{m \times n}$, is an m by n complex matrix whose entries are the positively polarized $B_1$ transmitted field at each of m position in the load caused by each of the n RF coil elements.

Next, let $w \in \mathbb{C}^n$ be the antenna drive weights applied to each of the antenna elements. The magnitude of w is the time harmonic current of the $j^{th}$ antenna and the complex angle is the applied phase. By the application of linear superposition theory, $B_1^{r+}w$ gives a column vector whose entries correspond to the net $B_1$ positively polarized transmit field at each point within the load. The magnitude of this gives the named field intensity at all of the chosen points.

Formulation

The localization objective includes controlling $B_1^{r+}w$ such that a targeted region receives a relatively large magnitude of field while the magnitude of the field in the rest of the load is suppressed and, this is to be accomplished by designing w. A location near the center of the targeted region is selected and $|B_{1,targeted\ point}^{r+}w|$ is constrained to be unity. Next, an upper bound is placed on all $|B_1^{r+}w|$ in the suppression region. This upper bound is then minimized. The region that was previously called the targeted region will now become a transition region and will provide transition from the unity constrained target point to the suppression region.

By constraining the targeted point to unity magnitude, the targeted region is also partially filled with $B_1^{r+}$ field because the field variation of $B_1^{r+}$ is a linear combination of $B_1$ fields generated by the individual antenna elements. This $B_1$ spatial field variation is on the order of the wavelength in the human body which is approximately 9 cm at 9.4 T. Observed spatial field variation is somewhat higher due to the interaction of dielectric resonances, standing waves, scattering, attenuation and other phenomena in the human body, but spatial variation is limited nonetheless. This formulation makes the problem a solvable convex problem.

The convex optimization problem, as stated in words to this point, is written formally as minimize U subject to $B_{1,i}^{r+}w=1$ $i$=Target $|B_{1,i}^{r+}w| \leq U$ $i\epsilon$ Suppresion Region (3.3.4)

Suppression Region where U is an upper bound to be minimized.

The problem is now a second order cone problem and is convex.

Generating the $B_1^{r+}$ Matrix

In order to design the antenna weights as outlined above, the $B_1^{r+}$ matrix is determined. Numerous methods can be used for calculating this matrix. If a simulated load is to be used to determine $B_1^{r+}$, any electromagnetic simulation or closed form analytical technique can be used. These techniques include integral equation techniques, finite element methods, finite difference time domain techniques as well as analytical techniques, if they exist. The use of results obtained from some of these simulation techniques will be outlined in the results section. Alternatively, a $B_1$ map of an imaged object or patient can be used. The collection and use of a $B_1$ map of a phantom and patient is presented.

Solution of the Convex Optimization Problem

In order to simplify the discussion of the solution, the optimization problem outlined in the previous section is recast as a Quadratically Constrained Quadratic Program (QCQP). The QCQP formulation has the added benefit that implementation provides a more efficient solution. After reformulation, Newton's method for unconstrained optimization is discussed. Then, constraints are added using a log barrier function and equality constrained optimization. A description of the problem solution can be described in terms of the interior point method.

Reformulation

The final form of the Second Order Cone Problem (SOCP) outlined in equation 3.3.4 was:

minimize U subject to $B_{1,i}^{r+}w=1$ $i$=Target $|B_{1,i}^{r+}w| \leq U$ $i\epsilon$Suppression Region. (4.1.1)

If the inequality constraint is squared, and a new (arbitrary) constant of the same name is used to replace U, the constraint becomes $|B_{1,i}^{r+}w|^2 \leq U$. This can be shown to be completely equivalent to $w^H B_{1,i}^{r+H} B_{1,i}^{r+}w \leq U$ where H represents the Hermitian transpose. With this replacement and the replacement of the constant, the problem becomes:

minimize U subject to $B_{1,i}^{r+}w=1$ $i$=Target $w^H B_{1,i}^{r+H} B_{1,i}^{r+} w \leq U$ $i \epsilon$ Suppression Region. (4.1.2)

which is a QCQP. From this reformulation, the solution technique is simplified because the generalized log barrier of the second order cone can be avoided and is now replaced with a standard log barrier. In addition, an implementation based on this formulation is more efficient because QCQP solvers are generally more efficient than SOCP solvers.

Unconstrained Minimization

Various minimization techniques that can be used for solving unconstrained problems. The gradient descent and Newton's method are presented here. Suppose a function $f(x)$ exists which takes $x \epsilon \mathbb{R}^n$ and maps it to $\mathbb{R}$. If n=2, one can think of the x vector as the x and y position on a two dimensional Cartesian coordinate system. Then the value of $f(x)$ can be thought of as the third dimensional height of a surface in three dimensions. The aim of an unconstrained minimization technique is to find the minimum value of $f(x)$ over all values of x.

One approach to achieve this objective is to choose a starting point and proceed 'downhill'. That is to say, take repeated steps in the $-\nabla f(x)$ direction until a minima is reached. This is named the gradient descent technique.

In general, there is no guarantee that the minima reached is a true global minima and not a local minima. True global optimality is guaranteed through formulation as a convex optimization problem. This is because convex problem formulation guarantees no local minima can exist.

Newton's method is similar to the gradient descent technique but it uses second order information about the system to achieve more rapid convergence. In addition to first derivative information, the second derivative information is also used. This allows the method to approximate the function as a paraboloid and (analytically) minimize this approximation.

The second order Taylor approximation of the function $f(x)$ at $x_n$ is $$\hat{f}(x_n + \Delta x) = f(x_n) + \nabla f(x)^T \Delta x + \frac{1}{2} \Delta x^T \nabla^2 f(x_n) \Delta x \quad (4.2.3)$$

Setting the derivative equal to zero and solving gives a minimum at $x_n = \nabla^2 f(x_n)^{-1} \nabla f(x_n)$. Note that the second derivative is always positive since the expansion is approximating a convex function. Setting $x_{n+1}$ equal to this value completes the Newton step. This process can be repeated until a minima is reached. In practice Newton's method does not always converge. To protect against this, the Guarded Newton Method or Backtracking Newton Method can be used.

Adding Constraints

In addition to the minimization of the objective function, the constraints of an optimization are to be observed. In the QCQP of interest, there are two types of constraints. The first is an equality constraint. This constraint ensures that the magnitude of field at the targeted point is unity.

Equality constraints can be addressed through a redefinition of the search space. Since the equality is an affine function, the optimization search space can be redefined to search only within the subspace that satisfies the constraint. Suppose $Ax=b$ is the constraint and $\{x|Ax=b\}=\{Fz+\hat{x}|z\in \mathbf{R}^{n-p}\}$ where $\hat{x}$ is any particular solution to $Ax=b$ and $F \in \mathbf{R}^{x \times (n-p)}$ has a range equal to the null space of A. The optimization is now recast to operate on the n-p dimensional space of z. After optimization, the optimal point, $x^*$ can be recovered from the solution, $z^*$, by the transformation, $x^*=Fz^*+\hat{x}$.

After using the above technique, Newton's method can be applied and unconstrained optimization can proceed as presented earlier.

The second set of constraints in the localization problem are the inequality constraints. Notice that there are arbitrarily many of these constraints, one for each point in the suppression region. Since the suppression region can be defined in many ways and gridded with arbitrary accuracy, care must be taken so as not to overwhelm the memory of the computer with upper-bound constraints.

To mathematically accommodate the inequality constraint, a particular technique is applied. The idea is to use a barrier function that grows unbounded as the objective function approaches an inequality constraint. This barrier function is added to the objective function and unconstrained minimization can again be applied. The barrier can be a log barrier function which takes the form $-(1/t)\log(-f_i(x))$ where t is a 'sharpness' constant. This barrier grows unbounded as $-f_i(x) \rightarrow 0^-$. After the addition of the barrier function to the objective function, the minimization becomes:

minimize $U-(1/t)\Sigma_i \log(w^H B_{1,i}^{i+H} B_{1,i}^{i+} w-U)$ i ∈ Suppression Region subject to $B_{1,i}^{i+}w=1$ i=Target        (4.3.4)

As the value of t is increased, the 'sharpness' of the barrier function is increased. A very small value of t will result in a gradual sweeping rise as the constraints are reached while a very large value of t will result in an abrupt rise.

Interior Point Method

The interior point method controls the parameter t in the log barrier function. Too small of a value and the objective function will be unnecessarily affected by the barrier away from the boundary. Too large of a value and the unconstrained Newton's method minimization will take steps outside of the feasible region too readily. Using the interior point method, parameter t is gradually varied while Newton steps are being taken.

The method is broken into two steps which are iterated until sufficient accuracy is reached. Consider that a point in the feasible region is selected to begin minimization. Next, t is set to a fairly small value and several Newton steps are taken until the minima is reached. This will achieve a first optimal point, $x_1^*$, near the geometric center of the feasible region. Next, increase t slightly, use $x_n^*$ as the starting point and perform Newton steps until a new $x_{n+1}^*$, is reached.

Computing a new $x_{n+1}^*$, is named the centering step. The value of t is then increased and the process is repeated. The path mapped out by $x_n^*$, is named the central path. Arbitrary accuracy can be reached by increasing t the necessary number of times and recomputing the center. If rigorous bounds on the accuracy of the computed point are required, the dual problem can be computed and a bound on the accuracy can be achieved by duality theory. The amount by which to increase t and the number of Newton iterations required to sufficiently re-center are open areas of research.

The results presented herein were generated by the Matlab toolbox SeDuMi program which performs a primal dual interior point method search over self dual cones. To simplify programming, the SeDuMi user interface CVX, which enforces disciplined convex programming, can be used.

Hardware Setup

Magnet

In one example, the super-conducting solenoidal magnet used is a Magnex MRBR 9.4 T with 650 mm bore diameter. The magnet contains 354 km of multifilament NbTi conductor carrying 218 amps with 78 MJ of stored energy.

Console

In one example, the console is used to control the gradients and RF pulse sequences and includes a Varian Unity Inova Console. In one example, this console is configured to drive a single transmit and receive channel.

Digital Receiver

To accommodate the multi-channel nature of the parallel transceiver architecture, a separate, 16-channel, receiver is used. This digital receiver uses sixteen 64 megasample per second, 14-bit analog to digital converters to sample a 20 MHz IF signal resulting in 20 effective bits.

Phase and Gain Controller

In addition to the multi-channel receiver, a multi-channel transmit path is used. A 16-channel phase and gain controller generates 16 signals by phase shifting and attenuating a reference signal according to the specifications of the optimization algorithm.

Power Amplifiers

After generation, the reference signals are amplified by sixteen 500 W amplifiers directly feeding the RF coil.

Parallel Head Coil

In various examples, an 8-channel, 16-channel, or other number of channels are used. The coil, In one example, is a TEM head coil.

Results

Finite Element Method

In one example, a numerical example begins with the creation of the $B_{1,x}^{i+}$ and $B_{1,y}^{i+}$ data. An isotropic cylindrically shaped phantom can be placed coaxially in a RF Coil (see FIG. 9A, FIG. 9B, and FIG. 9C).

The phantom approximates a human head in an appropriately sized MRI RF coil. As such, the phantom is given physical parameters similar to the human head ($\epsilon_r \approx 81, \sigma \approx 0.5$ S/m).

One port of the RF Coil is driven via a coax line. The data for all ports is obtained by circular symmetry. This model was simulated using a Finite Element Method software package and resulted in $B_1$ and By data. Some of this data is presented in FIG. 10. This data set was used to gain familiarity with the modes of operation of the structure. Localization was not performed.

Figure 9A:
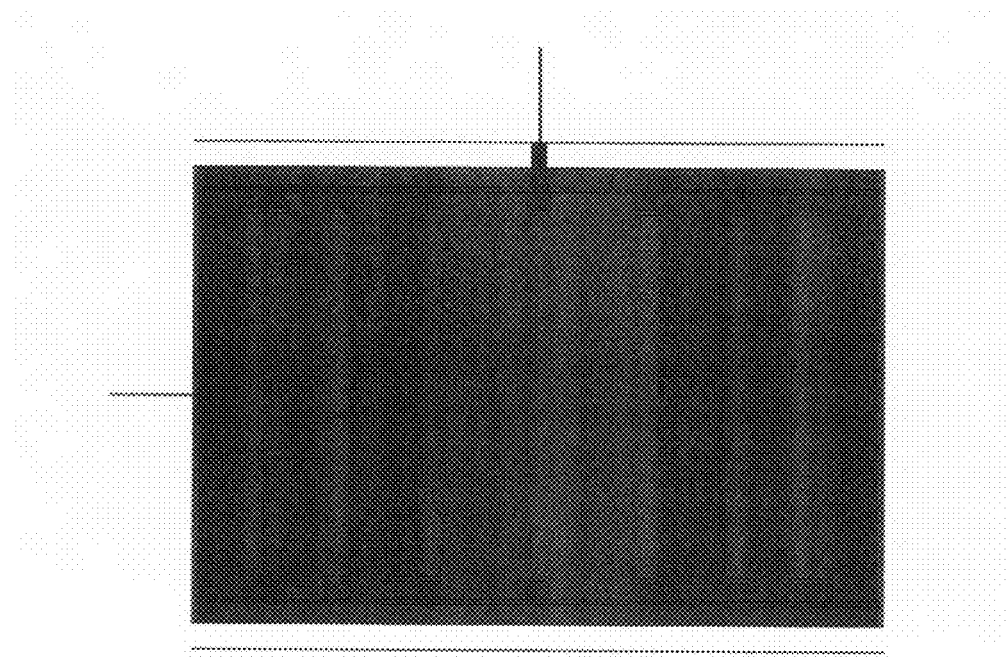
FIG. 9 illustrates a TEM coil model.
Figure 9B:
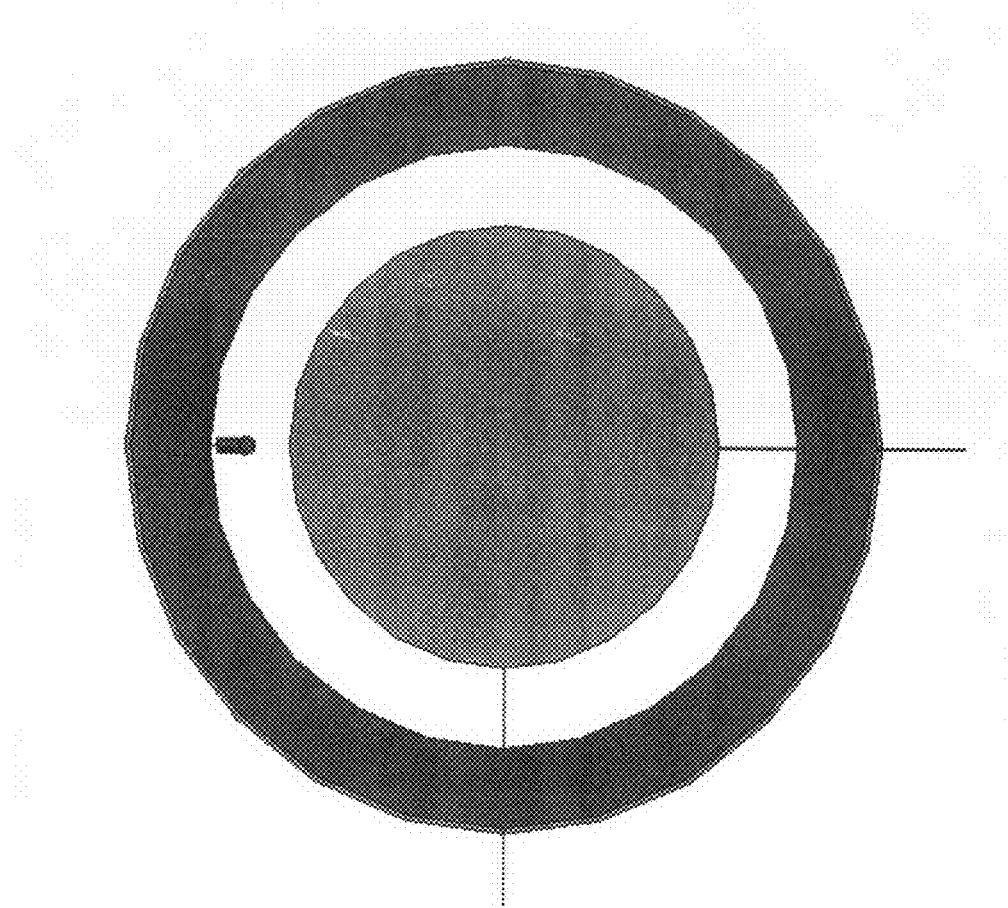
Figure 9C:
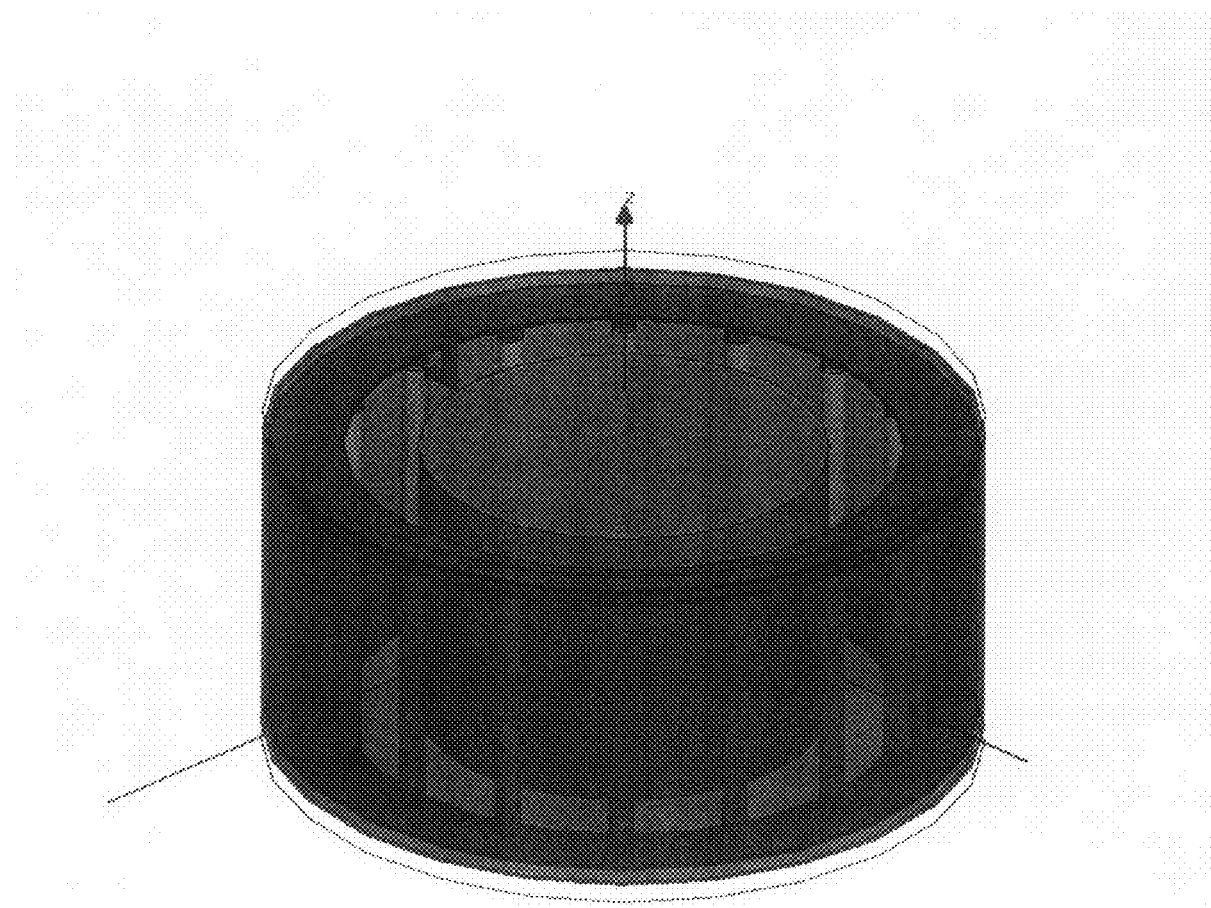

FIGS. 9A, 9B, and 9C illustrates side view, end view, and isometric view of an TEM RF coil model, H field magnitude, Y direction H field phase of Y direction H field, respectively.

Finite Difference Time Domain

Due to the availability of a highly accurate human body model, the Finite Difference Time Domain (FDTD) can be used to study RF propagation into the body. Data of RF propagation into a human head can be used.

FIG. 11 illustrates Finite Difference Time Domain Results for a first set of data. In particular, FIG. 11 shows front to back control of the localization for this 16-channel head coil and head.

Simulations can be run with each individual channel of a 16-channel head coil excited at 400 MHz. The steady state x, y and z direction harmonic $B_1$ field components are then exported at 130×130 grid points on an axial plane. The $B_1^{r+}$ field magnitude and phase are computed from this data. Masks are used on the raw image to separate out different regions. One mask can be used to designate the location of free space and RF coil structures.

FIG. 12 illustrates Finite Difference Time Domain Results for a second set of data. In particular, FIG. 12 shows side to side control and the final row of plots show the effect of creating a larger selection region.

In one example, rather than optimize over these structures, the $B_1$ field data numerically computed for this region was removed from the optimization. Another mask can be used to select the region over which to minimize.

This region is the set of grid locations for which the optimization can applied. This mask can be used to exclude skin areas near RF coil elements where $B_1$ field reduction is difficult with the given head and coil geometry. The final mask can be used to determine the transition region and the targeted point.

The targeted point can be defined to be the geometric center of the final mask. Each of these mask sets can be seen in FIG. 11 and FIG. 12.

In one example, the optimization algorithm is executed on a SunBlade 2500 (Sun Microsystems, Inc., Santa Clara, Calif., USA) desktop computer with 2 Gb of RAM.

Run time can vary as the size of the suppression region varied depending upon mask region selection. For example, if a large transition region is selected, less suppression region remained. Since a smaller suppression region leads to fewer points over which to optimize and hence fewer inequality constraints, the run time was reduced.

In some examples, run times are under one minute for reasonably selected mask sets.

Figure 11A:
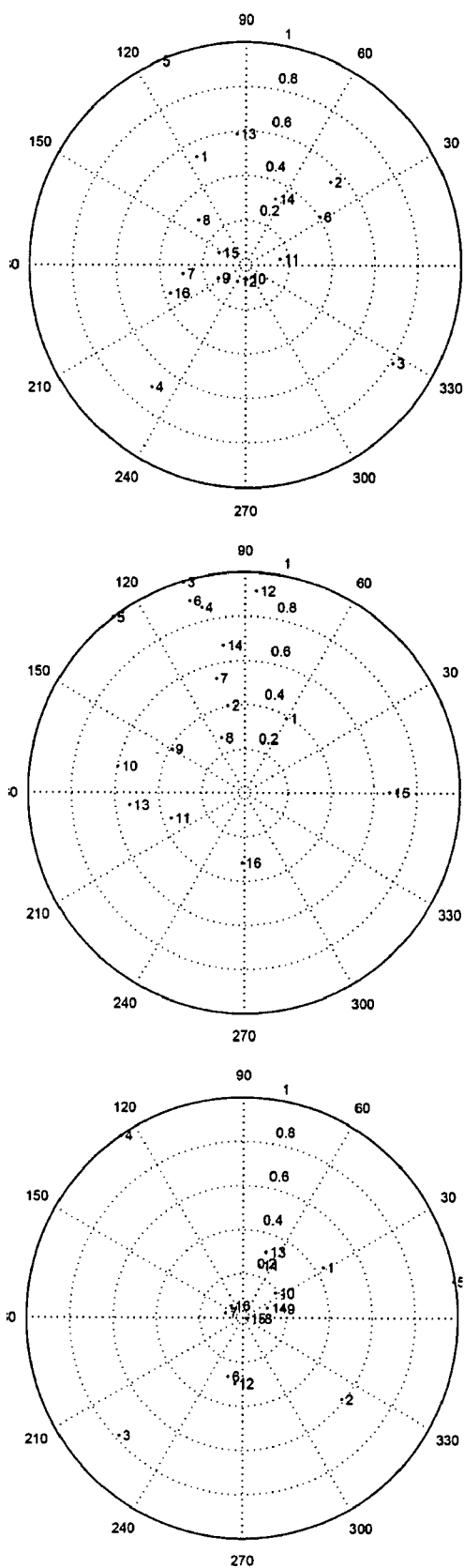
FIGS. 11 and 12 illustrate results using Finite Difference Time Domain.
Figure 11B:
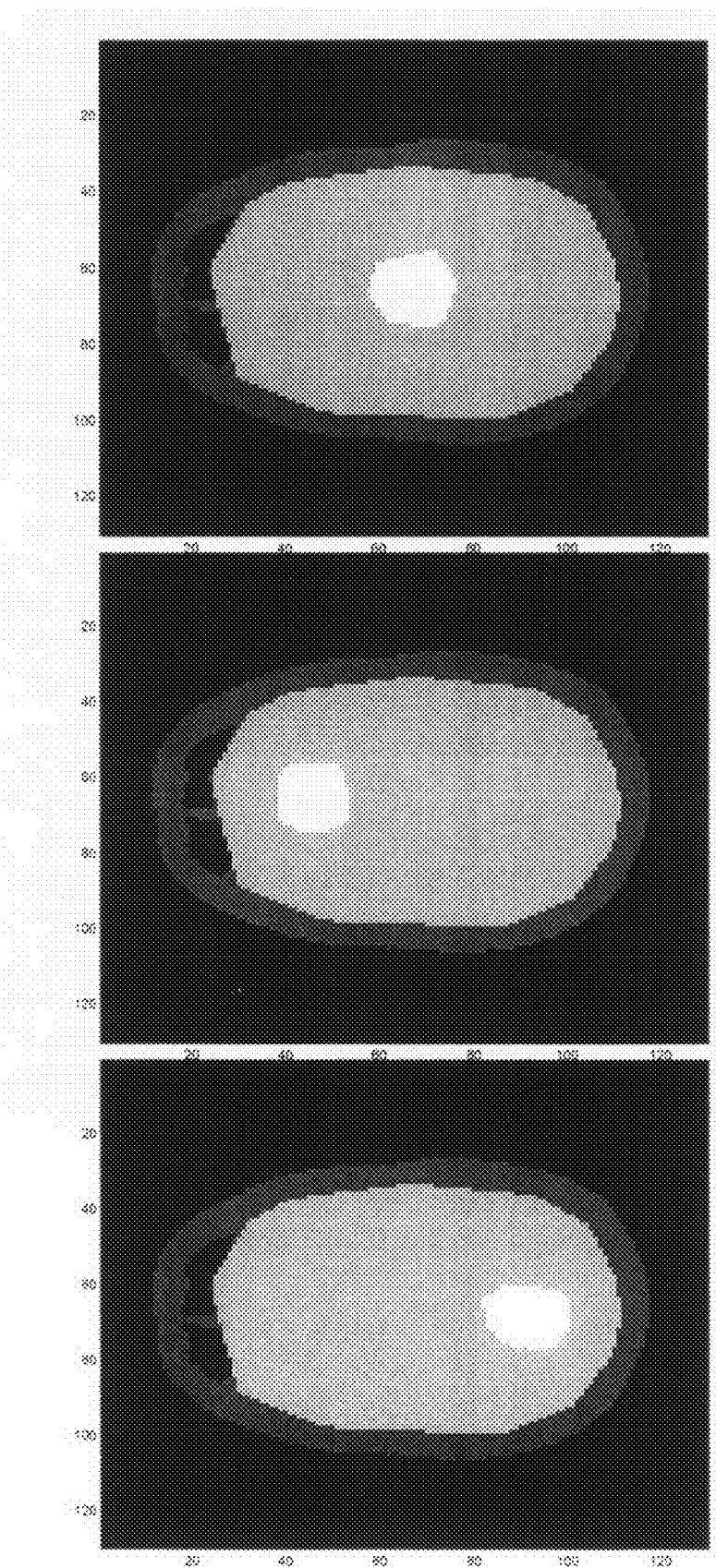
Figure 11C:
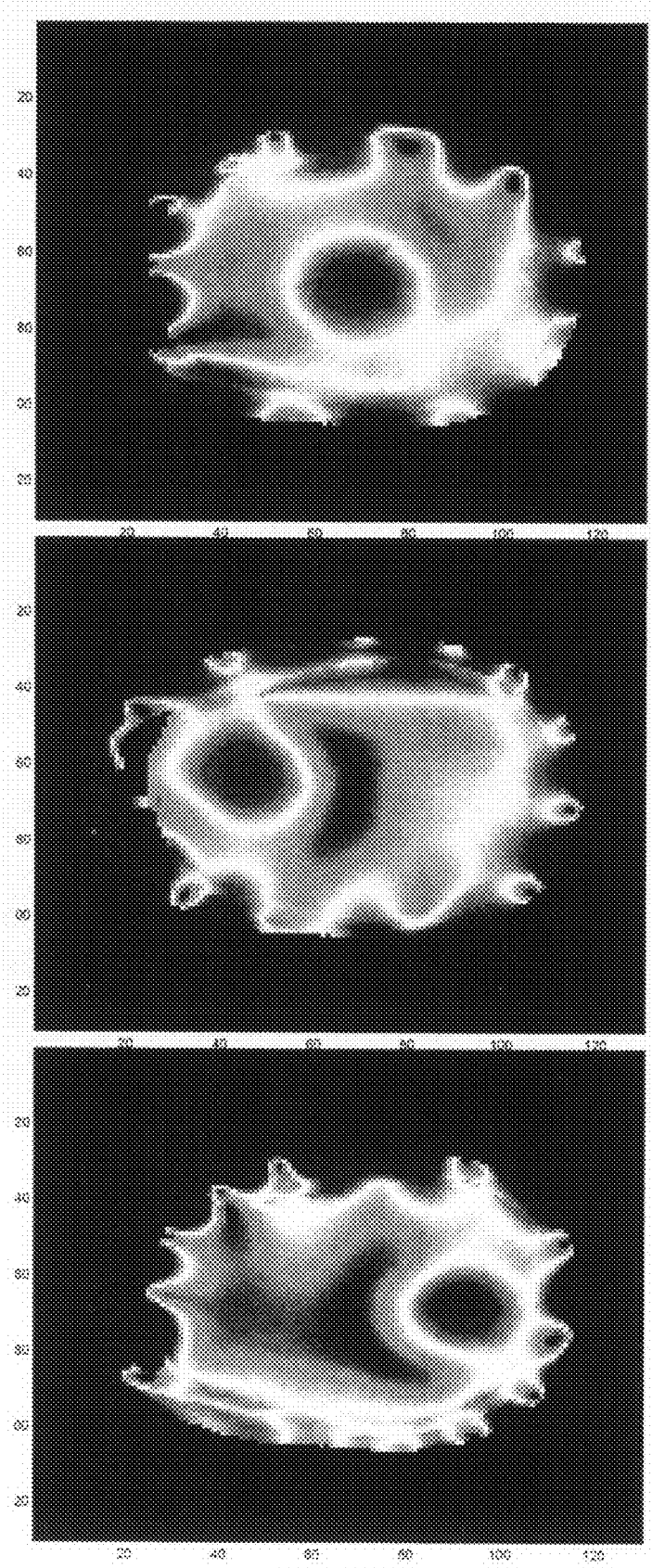
Figure 12A:
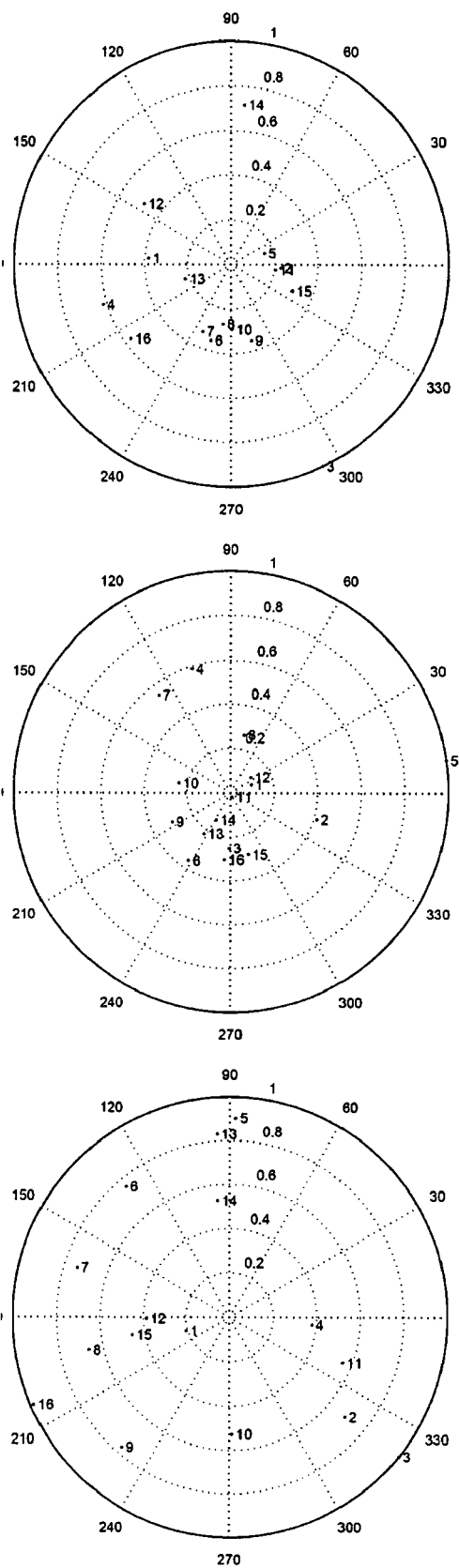

Some results of localization on sample FDTD human data are shown in FIG. 11 and FIG. 12. In particular, FIGS. 11A and 12A illustrate a polar representation of the weights designed by the localization algorithm. The radius of the points on these plots represent the linear magnitude of the weights and the angular locations represent the designed phase. These plots show that the optimal weights are highly non-intuitive. Further, they differ greatly from the standard drive parameters of equal magnitude and evenly spaced phase for all transmit coils. Since these weights appear to be random upon visual inspection, they will not be presented in further results.

Figure 12B:
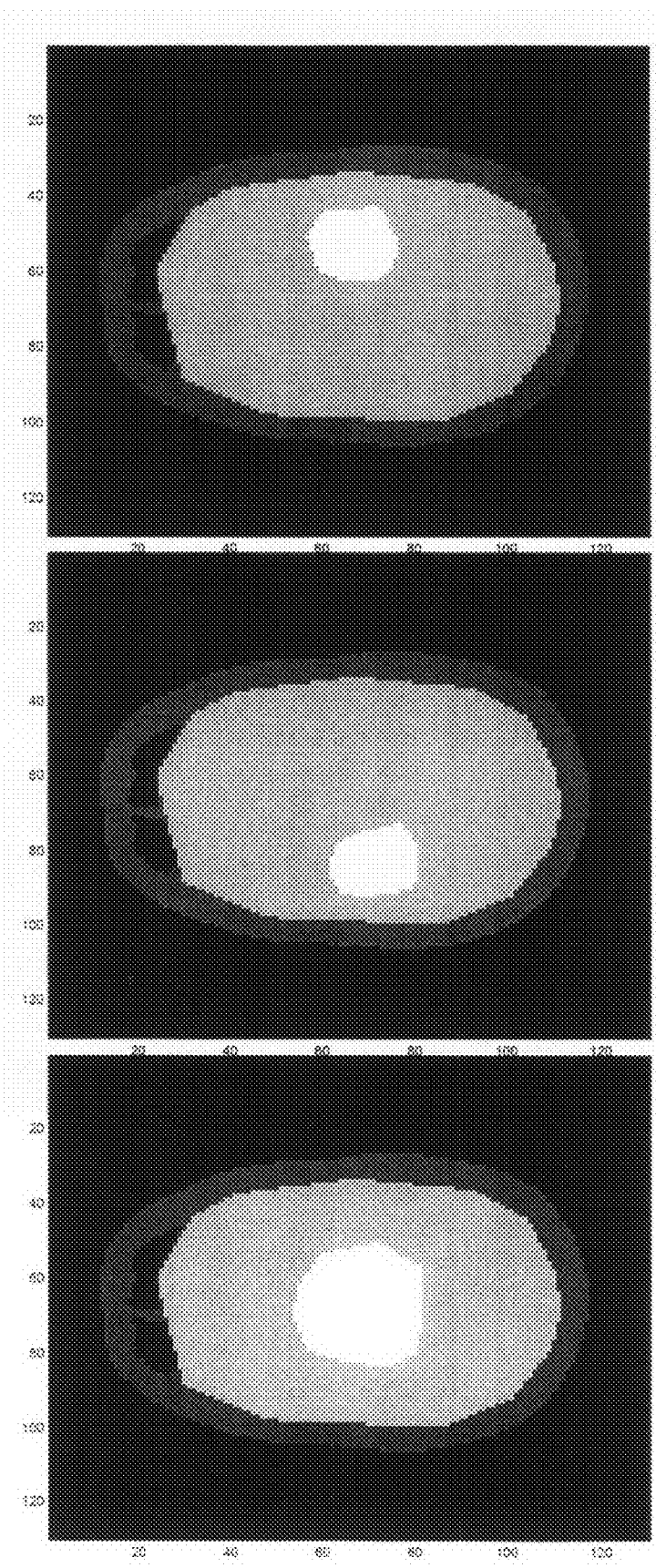

FIGS. 11B and 12B show the chosen mask sets. Here a region is shown to exclude the scalp, external fat layer and nasal cavity in the head as such regions are difficult to control due to the close proximity with the RF coil elements. The brightest sections show the target region.

In various examples, different mask shapes are used. Since, for this data, only a single point is selected and the limited spatial frequency variation of the RF field is relied upon to fill the remainder of the transition region, circular masks are used.

Figure 12C:
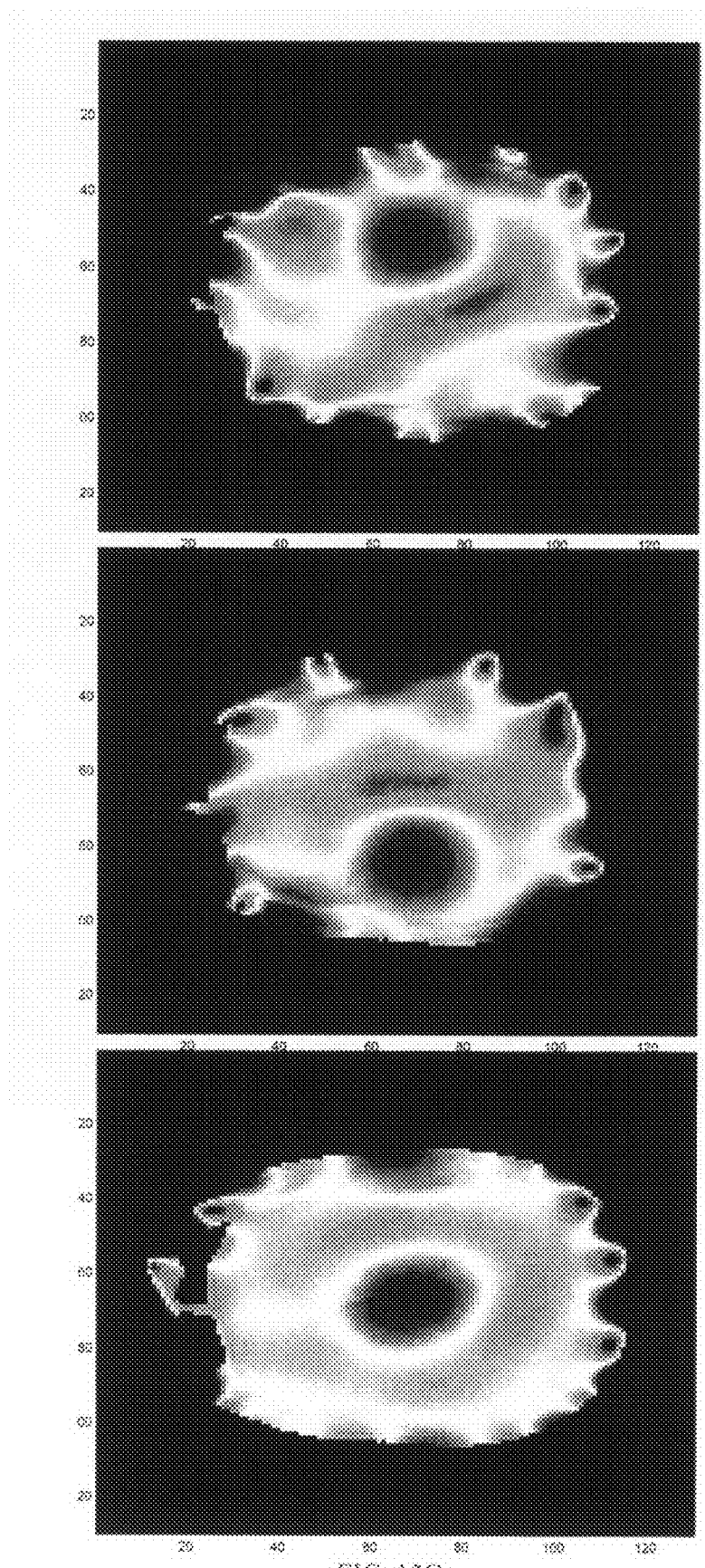

FIGS. 11C and 12C show the selected regions.

Phantom

After verification with FDTD numerical data, data on a phantom is collected at the 9.4 T, 65 cm bore system. A cylindrical phantom measuring 13 cm in diameter and 28 cm in length consisting of an aqueous solution 100 mM myo-inositol, 100 mM sodium chloride and 10 mM sodium acetate was used. The phantom was placed somewhat centrally in an 8-channel TEM head coil.

Data was collected with the FLASH imaging sequence at a resolution of 128 by 256. An axial slice of the phantom was chosen and a $B_1$ map was collected using the small angle approximation. The method is modified to accommodate a multi-channel receive system. The individual receive channels are combined to provide a single data set.

Figure 13A:
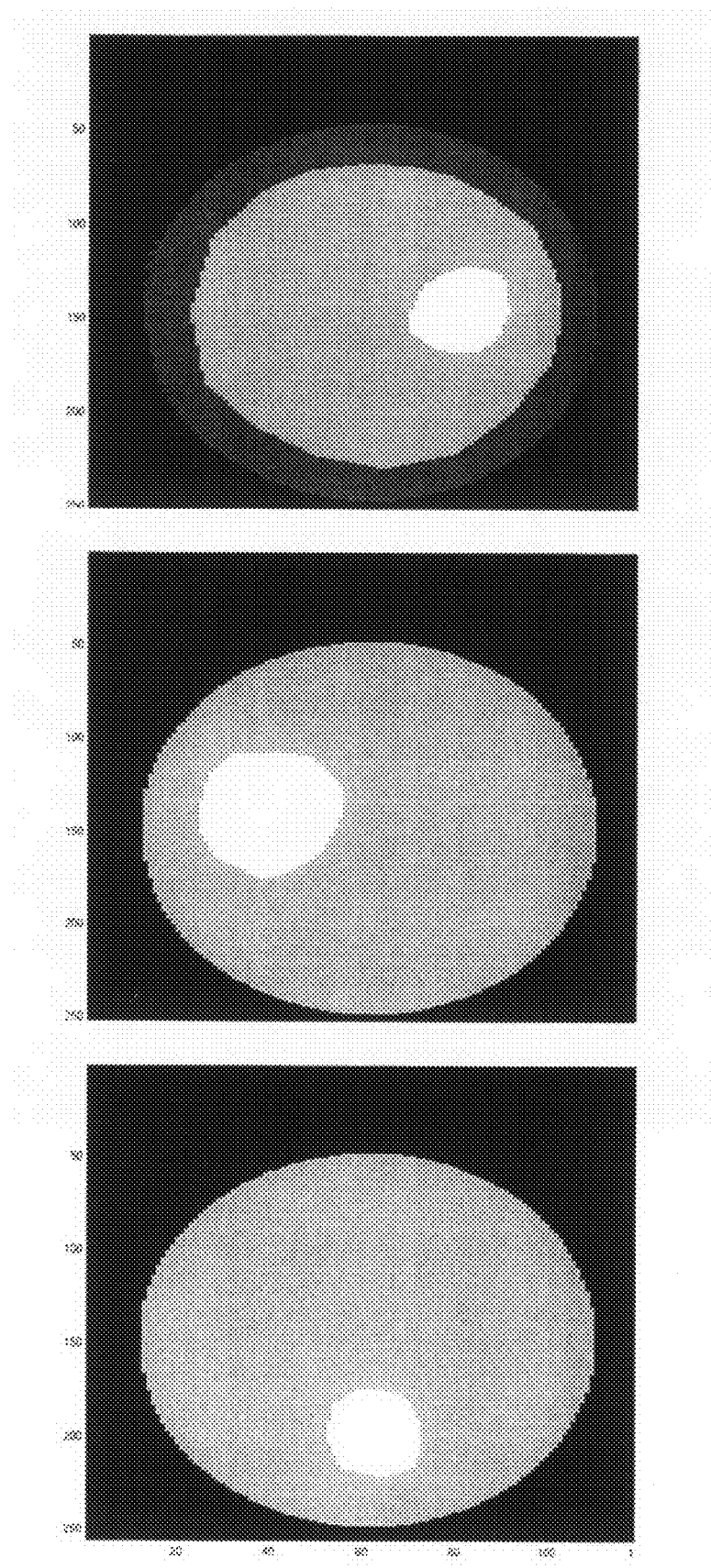
FIG. 13 illustrates results using a phantom.

FIG. 13 illustrates results using a phantom as described herein.

A $B_1$ map is generated using the double angle method. With this method two scans are collected with different flip angles and an arcsin is applied to the ratio of the two to calculate $B_1$ intensity. One intensity should be near a $\pi/2$ (90) flip angle and the second should be approximately half this value.

The flip angle varies with RF signal power, which is seen to be very inhomogeneous. In one example, two flip angles are collected and the arcsin method is applied. A magnitude is collected and a phase was not assigned to the map. The phase assignment is not determined due to the channel recombination technique. In one example, a phase assignment is calculated.

Consider image acquisition time using the double angle method to collect $B_1$ maps. A base image was collected at two flip angles to use as a reference for absolute phase. Then, images were collected at each transmit coil for two flip angles resulting in 18 images collected. Each image required 128 scan lines and each scan line required 7.5 seconds between scans for 3 $T_1$ relaxation. The mapping process required 4.8 hours to complete.

Rather than using the double angle method, a single low flip angle image can be collected with both phase and magnitude. The small angle approximation can be made and flip angle assumed to be linear with $B_1$. This reduces the number of images to be collected and the repetition time between scans. In one example, the mapping sequence is under 15 minutes.

Because of the choice of mapping technique, B $B_1^{r+}$ need not be directly mapped. Instead B $B_1^{r+}$ point-wise multiplied by $B_1^{r+}$, the receiver sensitivity to positively polarized field, and S, the signal caused by anatomy, can be mapped. Depending on the application of the pulse sequence this may be an acceptable approximation of $B_1^{r+}$.

A map can be collected with each transmit channel excited individually at the proton frequency. The datasets are then combined with a user specified mask set to complete the $B_1^{r+}$ matrix.

Figure 13B:
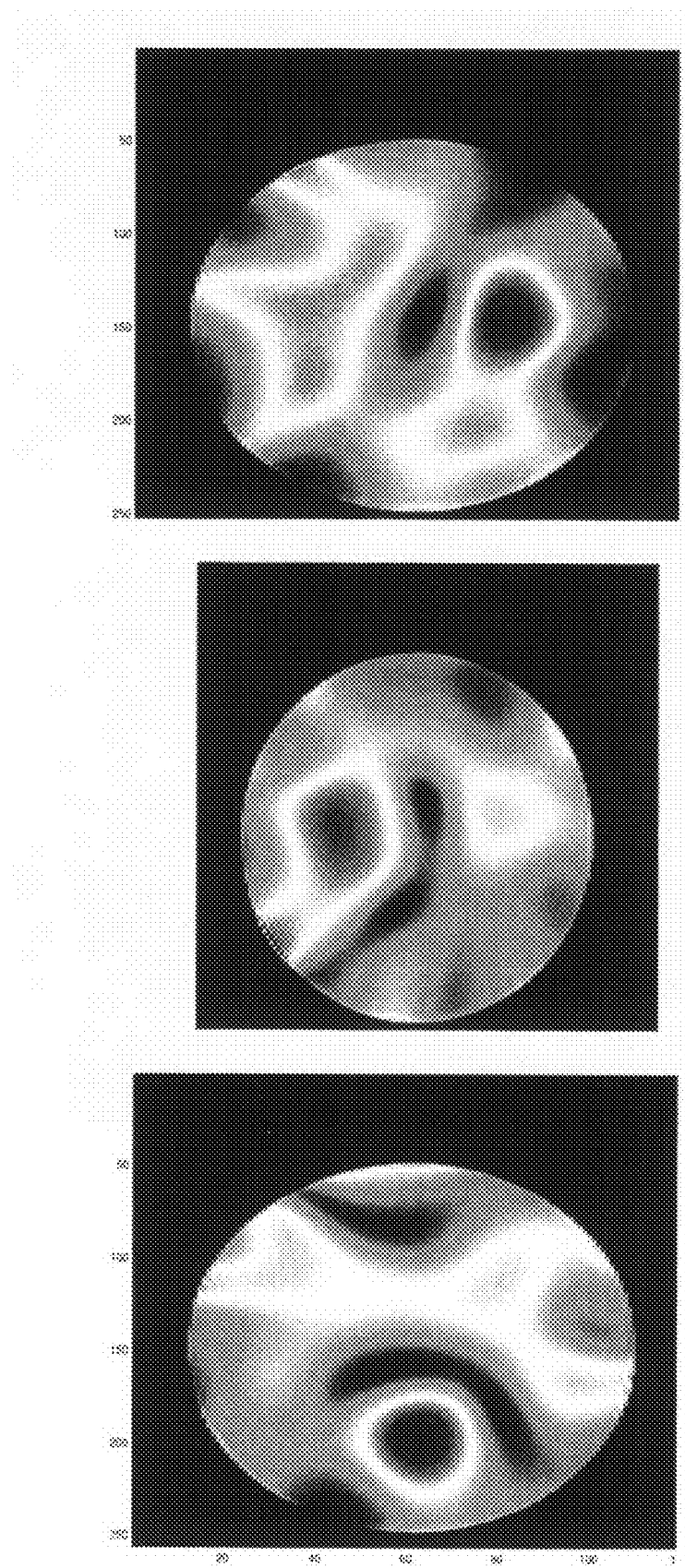
Figure 13C:
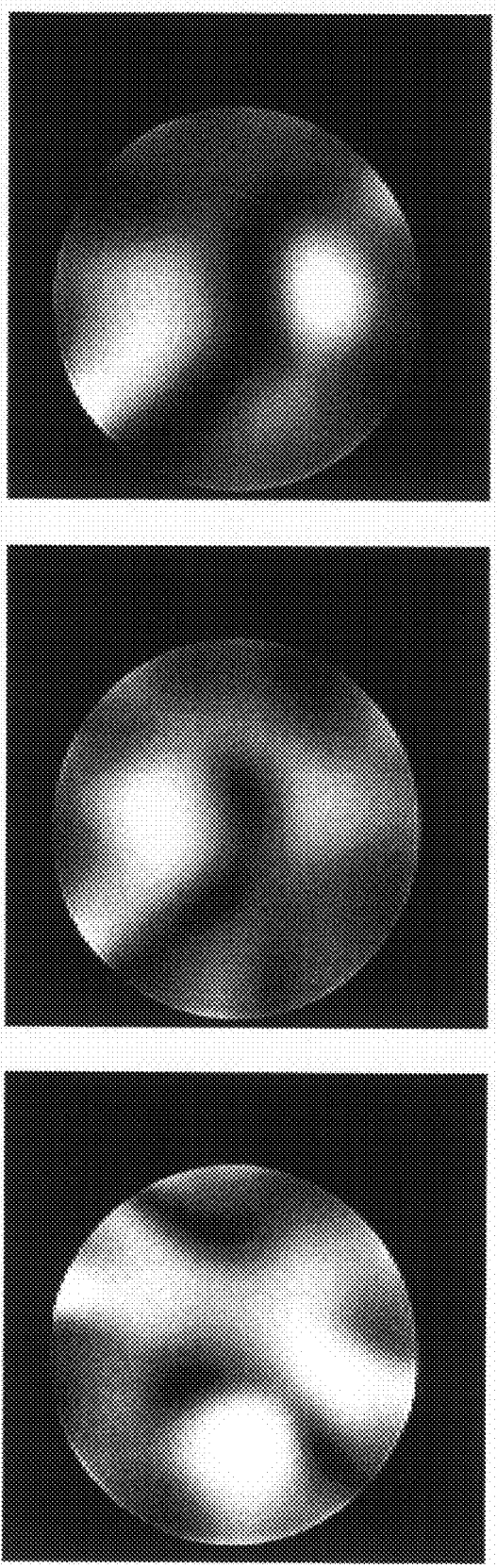

A desktop workstation, computer, or processor can be used to perform the localization with run times generally less than one minute for reasonably selected mask sets. In the measurement result shown in FIG. 13, a region mask was used with no effect on the outcome (FIG. 13A) and the mask was omitted in the subsequent two images (FIGS. 13B and 13C). In this set of results, the localization capability is reduced relative to the FDTD data and may be explained by the use of an 8-channel head coil as compared with the 16-channel coil used for the FDTD data. This may be a result of fewer degrees of freedom over which the optimization could operate.

Human Head Measurement

Localization can be conducted using a human subject in the 9.4 T system. Due to the limited time between patient movements, $B_1$ map acquisition, antenna weight design done by the optimization algorithm, and image data acquisition should be performed rapidly. If the patient were to move during any of these stages, the map used to generate the antenna weights may be affected. Convex formulation allows antenna weight design to proceed rapidly.

Using phantom measurements, the time to collect fully relaxed double angle $B_1$ maps was long. To reduce the time, low power settings can be used and the low flip angle approximation can be employed to calculate $B_1$ maps. This can reduce the number of images used to generate a map in half as compared to the double angle method. Additionally, the repetition time between scan lines can be reduced because of the low power setting. With these changes, $B_1$ map generation time can be reduced from hours to minutes.

Mask sets can be generated as with the FDTD data set and localization performed on selected regions of the head.

Additional Considerations

Other methods are also contemplated. By reducing the number of channels from 16 in the FDTD simulation to 8 in the phantom measurements, the resolving quality of the localization is reduced. Increasing the number of channels above 16 can improve resolving ability.

A suitable mathematical formulation can allow for multiple RF excitation time slots, thus, allow for a different weight set to be used for each of the time slices.

Convex optimization as described herein can be used not only for localization in the MRI field, but also for electromagnetic design and signal processing.

Other Localization Techniques

Other localization algorithms can be used. As noted, the FDTD method can be used to evaluate RF propagation in the human body. Using the FDTD solver, the weights applied to each of the RF coil elements can be adjusted and the RF fields recalculated.

In one example, an optimization algorithm uses a 2D pulse technique. The gradient fields are varied during the RF excitation stage. The variations set locations in Fourier Space (k space) and place RF power at those locations. The Fourier space and RF power are adjusted to 'paint' the inverse Fourier transform of the distribution selected. This algorithm includes mapping of the $B_1$ field and the $B_0$ field is completed. $B_0$ is mapped because the pulse length is long in comparison to the dephasing induced by the magnet inhomogeneity. This variation is taken into account and designed into the pulse sequence. Because of the length of the acquisition, this technique can be used for measurements of a phantom.

In addition to the $B_1$ and $B_0$ mapping setup time, the RF pulses are relatively long to reach a sufficient number of points in Fourier space, likely several orders of magnitude longer than the a typical imaging sequence.

ADDITIONAL EXAMPLES

Coil performance can be tailored to achieve a transverse field suitable for a excitation to provide a particular result. For example, the field can be tailored to achieve homogeneity for various loads or conditions. In one example, the field can be configured to be modulated in terms of phase, frequency, gain, spatially, or over time.

This subject matter can be used in conjunction with any type of coil having multiple elements that are separately controllable, examples include a TEM coil, or a birdcage coil, a surface coil or other type.

This subject matter can be used in conjunction with various types of receiving equipment, including amplifiers, switches, filters, network or communication appliances, magnets, or other equipment.

Coil elements can be driven with any particular signal including various phase, frequency, or gain.

In one example, a coil has at least one element that can be spatially configured based on a control signal. As such, an example of the present subject matter enables that a controllable element can be positioned to yield a particular field localization in accordance with an algorithm executed by the present subject matter.

In one example, an element of the coil can be driven with a particular signal to cause excitation at a particular time. Thus, the various elements in a multi-element coil can be driven in circular polarization or according to other parameters.

In one example, a number of coils or coil elements are operated in synchronous as described herein.

The field localization of the present subject matter can be achieved by solving a mathematical optimization problem. The problem can be formulated as a convex optimization problem, some examples of which include least-squares and linear programming problems. In one example, an interior-point method is used to solve the convex optimization problem. Other methods include semi-definite programs and second-order cone problems.

Convex optimization problems can include geometric programming or conic optimization (including second-order cone programming such as convex quadratically constrained quadratic programming or linear programming as well as semi-definite programming.

The present subject matter also includes a transmitter configured to provide a drive signal to excite the coil in the manner described. Two or more transmitters can be coupled, synchronized, and operated according to an algorithm as disclosed herein. In one example, a parallel transceiver is used to drive a coil as described herein.

One example of the present subject matter includes an algorithm for controlling operation of a coil using a parallel transceiver as described in U.S. Pat. No. 6,969,992, PARALLEL TRANSCEIVER FOR NUCLEAR MAGNETIC RESONANCE SYSTEM, Vaughan et al., and incorporated herein by reference. A processor of the parallel transceiver is configured to execute an algorithm as described herein.

A technique for localizing an RF field on a region of interest is disclosed. Convex optimization techniques can be used to formulate and solve a problem to design antenna weights which result in the localized $B_1$ field distributions. This can be used in spectroscopy and other areas of imaging where localization can be used to improve signal to noise ratio. Convex optimization can be used for controlling $B_1$ field and can facilitate uniform image intensity and improved SNR at high field.

CONCLUSION

The description is intended to be illustrative, and not restrictive. For example, the examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the invention should be determined with reference to the appended claims, along with the full scope of equivalents to which such claims are entitled.

What is claimed is:

1. A system comprising:
   a magnetic resonance coil having a plurality of individually controllable segments;
   a multi-channel driver, each channel of the driver coupled to a segment in one to one relation;
   a processor coupled to the driver and configured to control the coil; and
   a set of instructions executable by the processor, the set of instructions configured to execute a convex optimization algorithm, and further configured to obtain at least one of a minimized specific absorption rate (SAR), a localized SAR, a particular signal to noise ratio, and a particular contrast criterion.

2. The system of claim 1 wherein the algorithm is executed over a selected region.

3. The system of claim 1 wherein the algorithm includes a closed loop feedback iterative procedure.

4. The system of claim 1 wherein the processor provides time varying modulation of phase and magnitude using a convex optimization procedure.

5. A system comprising:
   a magnetic resonance coil having a plurality of individually controllable segments;
   a multi-channel driver, each channel of the driver coupled to a segment in one to one relation;
   a processor coupled to the driver and configured to control the coil; and
   a set of instructions executable by the processor, the set of instructions configured to execute a convex optimization algorithm, and further configured to obtain at least one of a uniform B1 field distribution, a localized B1 field distribution, a masked B1 field distribution, and a custom B1 field distribution.

6. The system of claim 5 wherein the algorithm is executed over a selected region.

7. The system of claim 6 wherein the selected region includes a three-dimensional surface or volume.

8. The system of claim 1 wherein the algorithm includes a closed loop feedback iterative procedure.

9. The system of claim 1 wherein the processor provides time varying modulation of phase and magnitude using a convex optimization procedure.

10. A method comprising:
    receiving a target field distribution for a transverse magnetic field within a coil for use in magnetic resonance imaging (MRI);
    executing a convex optimization algorithm to determine a solution corresponding to the target field distribution; and
    selecting a drive signal for a current element of the coil based on the solution.

11. The method of claim 10 wherein selecting the drive signal includes selecting at least one of a phase, a magnitude, and a frequency.

12. The method of claim 10 wherein receiving the target field distribution includes receiving at least one of a uniform distribution, a localized distribution, and a masked distribution.

13. The method of claim 10 wherein executing the convex optimization algorithm includes executing a program on a computer.

14. The method of claim 10 wherein executing the convex optimization algorithm includes minimizing a specific absorption rate (SAR).

15. The method of claim 10 wherein executing the convex optimization algorithm includes achieving a localized specific absorption rate (SAR).

16. The method of claim 10 wherein receiving the target field distribution includes receiving a distribution for a three-dimensional surface.

17. The method of claim 10 wherein receiving the target field distribution includes receiving a distribution for a volume.

18. The method of claim 10 further including iteratively repeating the executing and selecting.

19. The method of claim 10 wherein selecting the drive signal includes selecting a time varying signal.

20. The method of claim 10 wherein selecting the drive signal includes selecting a spatial position for the current element.

* * * * *

UNITED STATES PATENT AND TRADEMARK OFFICE
CERTIFICATE OF CORRECTION

PATENT NO. : 7,633,293 B2  Page 1 of 1
APPLICATION NO. : 11/800055
DATED : December 15, 2009
INVENTOR(S) : Christopher C. Olson et al.

It is certified that error appears in the above-identified patent and that said Letters Patent is hereby corrected as shown below:

In the Specification:

In Column 1, Lines 14 to 19 delete the following:

"GOVERNMENT RIGHTS

This invention was made with Government support under Grant Numbers NIH-R01 EB000895 and NIH-P41 RR08079, awarded by the National Institutes of Health. The Government has certain rights in this invention."

and add the following:

--GOVERNMENT INTEREST

This invention was made with government support under R01-EB000895 and 5P41-RR008079 awarded by the National Institutes of Health. The government has certain rights in the invention.--

Signed and Sealed this
Twenty-third Day of April, 2013

Teresa Stanek Rea
*Acting Director of the United States Patent and Trademark Office*